(12) United States Patent
Yamada

(10) Patent No.: US 9,246,471 B2
(45) Date of Patent: Jan. 26, 2016

(54) RESONATOR ELEMENT, RESONATOR, OSCILLATOR, ELECTRONIC DEVICE, AND MOBILE OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/541,893

(22) Filed: Nov. 14, 2014

(65) Prior Publication Data

US 2015/0137901 A1    May 21, 2015

(30) Foreign Application Priority Data

Nov. 16, 2013  (JP) ................. 2013-237479

(51) Int. Cl.
| | |
|---|---|
| *H03B 5/32* | (2006.01) |
| *H03H 9/215* | (2006.01) |
| *H03H 9/02* | (2006.01) |
| H03H 3/04 | (2006.01) |

(52) U.S. Cl.
CPC ............. *H03H 9/215* (2013.01); *H03B 5/32* (2013.01); *H03H 9/02023* (2013.01); *H03H 9/02157* (2013.01); *H03H 2003/0407* (2013.01)

(58) Field of Classification Search
CPC ............. G04F 5/04; G04F 5/06; G04F 5/063; H03B 5/30; H03B 5/32; H03H 9/17; H03H 9/21; H03H 9/215; H03H 9/2468; H03H 9/2473; H03H 9/2478; H03H 9/2484; H03H 9/2489; H03H 9/2494; H03H 2003/026; H03H 2003/0492

USPC .......... 310/311, 312, 348, 370; 331/154, 156, 331/158

See application file for complete search history.

(56) References Cited

U.S. PATENT DOCUMENTS

| | | | | |
|---|---|---|---|---|
| 7,368,861 | B2 * | 5/2008 | Tanaya .................. | 310/370 |
| 8,093,787 | B2 * | 1/2012 | Ichikawa .............. | 310/370 |
| 2005/0134154 | A1 * | 6/2005 | Kawashima .......... | 310/370 |
| 2006/0082261 | A1 * | 4/2006 | Tanaya .................. | 310/370 |
| 2007/0075611 | A1 | 4/2007 | Kawashima | |
| 2009/0289530 | A1 * | 11/2009 | Kawanishi ............ | 310/370 |
| 2010/0156246 | A1 | 6/2010 | Iwai | |

FOREIGN PATENT DOCUMENTS

| | | |
|---|---|---|
| JP | A-2005-039767 | 2/2005 |
| JP | A-2007-006091 | 1/2007 |
| JP | A-2007-006375 | 1/2007 |
| JP | A-2007-013910 | 1/2007 |
| JP | A-2009-253622 | 10/2009 |
| JP | A-2010-147953 | 7/2010 |
| JP | A-2012-023428 | 2/2012 |
| JP | A-2012-039226 | 2/2012 |

\* cited by examiner

*Primary Examiner* — Levi Gannon
(74) *Attorney, Agent, or Firm* — Oliff PLC

(57) ABSTRACT

A resonator element includes a base, a quartz crystal resonator blank which is integrally disposed with the base, and has a pair of vibrating arms which are disposed in parallel in an X axial direction, and extend from the base in a Y' axial direction, the vibrating arms include arms, hammerheads which are positioned on tip end sides of the arms, and are longer than the arms in the X axial direction, a relationship of 0.033×T [μm]<W4<0.330×T [μm] is satisfied when the thickness of the vibrating arm is set to T in thickness, and a distance between the hammer heads in the X axial direction is set to W4.

25 Claims, 30 Drawing Sheets

LOW R1 FIGURE

OCCUPANCY FACTOR OF HAMMER HEAD

LOW R1 FIGURE

OCCUPANCY FACTOR OF HAMMER HEAD

RESONATOR ELEMENT, RESONATOR, OSCILLATOR, ELECTRONIC DEVICE, AND MOBILE OBJECT

CROSS REFERENCE

The entire disclosure of Japanese Patent Application No. 2013-237479 filed Nov. 16, 2013 is expressly incorporated by reference herein.

BACKGROUND

1. Technical Field

The present invention relates to a resonator element, a resonator, an oscillator, an electronic device, and a mobile object.

2. Related Art

In recent years, a resonator element using a quartz crystal has been known. The resonator element has good frequency-temperature characteristics, and thus is widely used as reference frequency sources or transmission sources of various electronic devices, and the like.

A resonator element disclosed in JP-A-2005-39767 is a tuning fork type resonator element, and has a base and a pair of vibrating arms which extend from the base.

A technique in JP-A-2005-39767 has been proposed in which a distance between the pair of vibrating arms is set to be in a range of 50 µm to 370 µm when the resonator element having such a configuration is formed by using photolithography technology, and thus a size of the formed resonator element can be reduced.

However, setting of the distance within the range can be determined to be insufficient for the need for minimization of the resonator element.

SUMMARY

An advantage of some aspects of the invention is to provide a resonator element capable of being further reduced in size, and a resonator, an oscillator, an electronic device, and a mobile object including the resonator element.

The invention can be implemented as the following application examples.

Application Example 1

A resonator element according to this application example includes: a base; and a pair of vibrating arms which extend from the base in the first direction in a plan view, respectively include a weight portion and an arm disposed between the weight portion and the base and are disposed in parallel in a second direction, when orthogonal directions are set as first direction and second direction, in which when the vibrating arm is set to T in thickness, and a distance between the weight portions is set to W4 in the second direction, the following relationship is satisfied.

$$0.033 \times T < W4 < 0.330 \times T \ [\mu m]$$

With this configuration, it is possible to realize a reduced size of the resonator element.

Application Example 2

In the resonator element according to the application example described above, it is preferable that the T is in a range of 50 µm≤T≤140 µm.

With this configuration, it is possible to obtain a quartz crystal resonator blank having a high Q value.

Application Example 3

In the resonator element according to the application example described above, it is preferable that the T is in a range of 110 µm≤T≤140 µm.

With this configuration, it is possible to obtain a quartz crystal resonator blank having a low equivalent series resistance.

Application Example 4

In the resonator element according to the application example described above, it is preferable that when the length of the vibrating arm in the first direction is set to L, and the length of the weight portion in the first direction is set to H, the following relationship is satisfied.

$$0.183 < H/L < 0.597$$

With this configuration, it is possible to obtain a resonator element having a further reduced size and a further high Q value.

Application Example 5

In the resonator element according to the application example described above, it is preferable that when the length of the vibrating arm in the first direction is set to L, and the length of the weight portion in the first direction is set to H, the following relationship is satisfied.

$$0.012 < H/L < 0.30$$

With this configuration, it is possible to reduce equivalent series resistance of a resonator element, and thus to obtain a resonator element having vibrating characteristics of low vibration loss.

Application Example 6

In the resonator element according to the application example described above, it is preferable that the vibrating arm is provided with grooves respectively on a first main surface and a second main surface which have a relationship of the front and back, and when a summation of the depth of the groove on the first main surface and the depth of the groove on the second main surface is set to ta, ta/T is set to η, and a width of the main surface in the second direction between an outer circumference of the vibrating arm and the groove is set to W3 in a plan view, the following relationship is satisfied.

$$4.236 \times 10 \times \eta^2 - 8.473 \times 10 \times \eta + 4.414 \times 10 \ [\mu m] \leq W3 \leq -3.367 \times 10 \times \eta^2 + 7.112 \times 10 \times \eta - 2.352 \times 10 \ [\mu m]$$

With this configuration, it is possible to obtain a resonator element having a high Q value and excellent vibrating characteristics.

Application Example 7

A resonator according to this application example includes: the resonator element according to the application example described above; and a package storing the resonator element.

With this configuration, it is possible to realize a resonator reduced in size.

Application Example 8

An oscillator according to this application example includes: the resonator element according to the application example described above; and an oscillation circuit electrically connected to the resonator element.

With this configuration, it is possible to realize an oscillator reduced in size.

Application Example 9

An electronic device according to this application example includes the resonator element according to the application example described above.

With this configuration, it is possible to realize an electronic device reduced in size.

Application Example 10

A mobile object according to this application example includes the resonator element according to the application example described above.

With this configuration, it is possible to realize a mobile object reduced in size.

BRIEF DESCRIPTION OF THE DRAWINGS

The invention will be described with reference to the accompanying drawings, wherein like numbers reference like elements.

FIG. 13 is a perspective view describing an effective width a.

FIG. 19 is a graph illustrating a relationship of W3 and $Q_{TED}$a.

DESCRIPTION OF EXEMPLARY EMBODIMENTS

Hereinafter, a resonator element, a resonator, an oscillator, an electronic device, and a mobile object according to the invention will be described in detail based on appropriate embodiments illustrated in the accompanying drawings.

1. Resonator

A resonator according to the invention will be described.
First Embodiment

Figure 1:
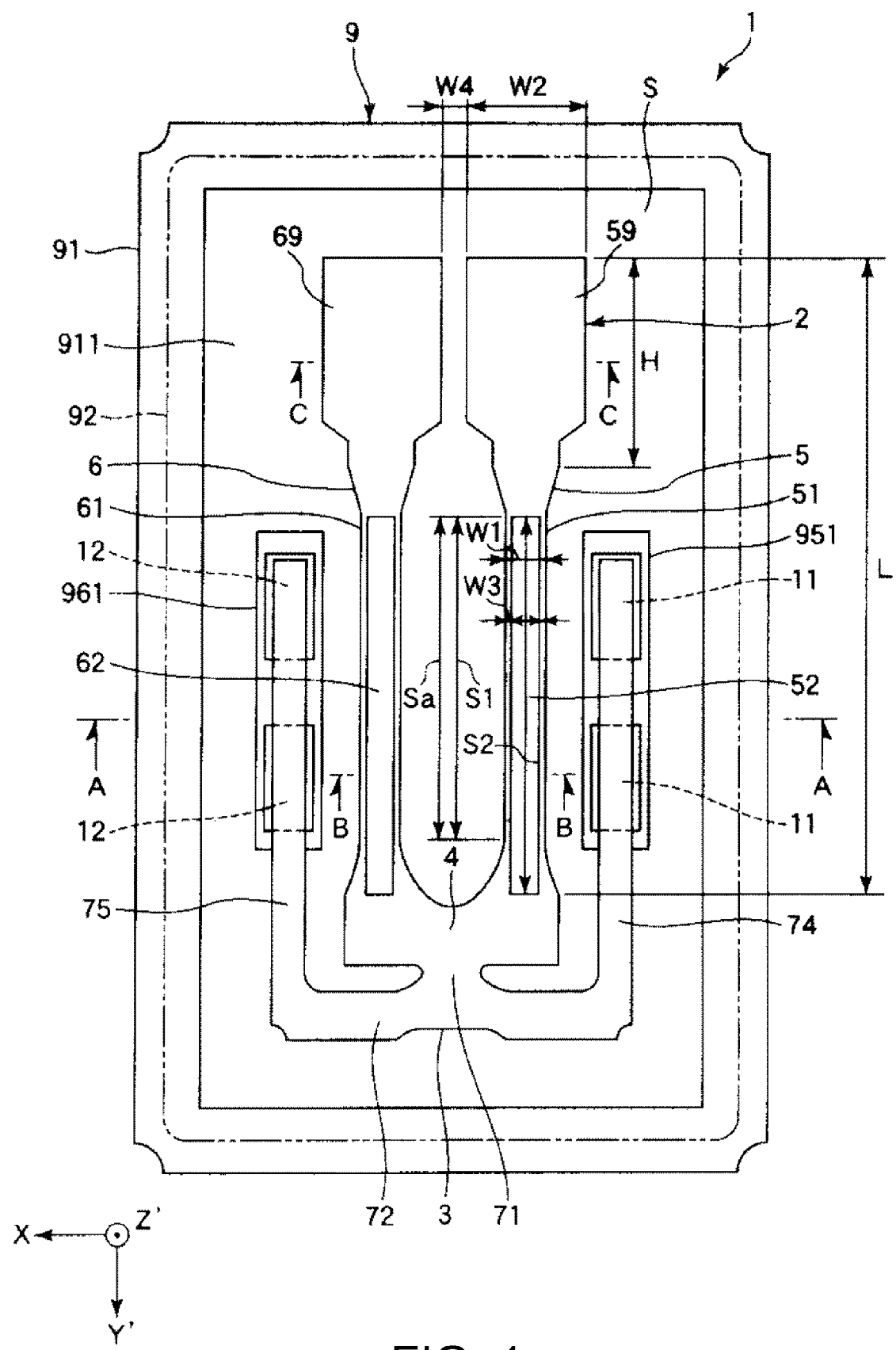
FIG. 1 is a plan view of a resonator according to a first embodiment of the invention.
Figure 2:
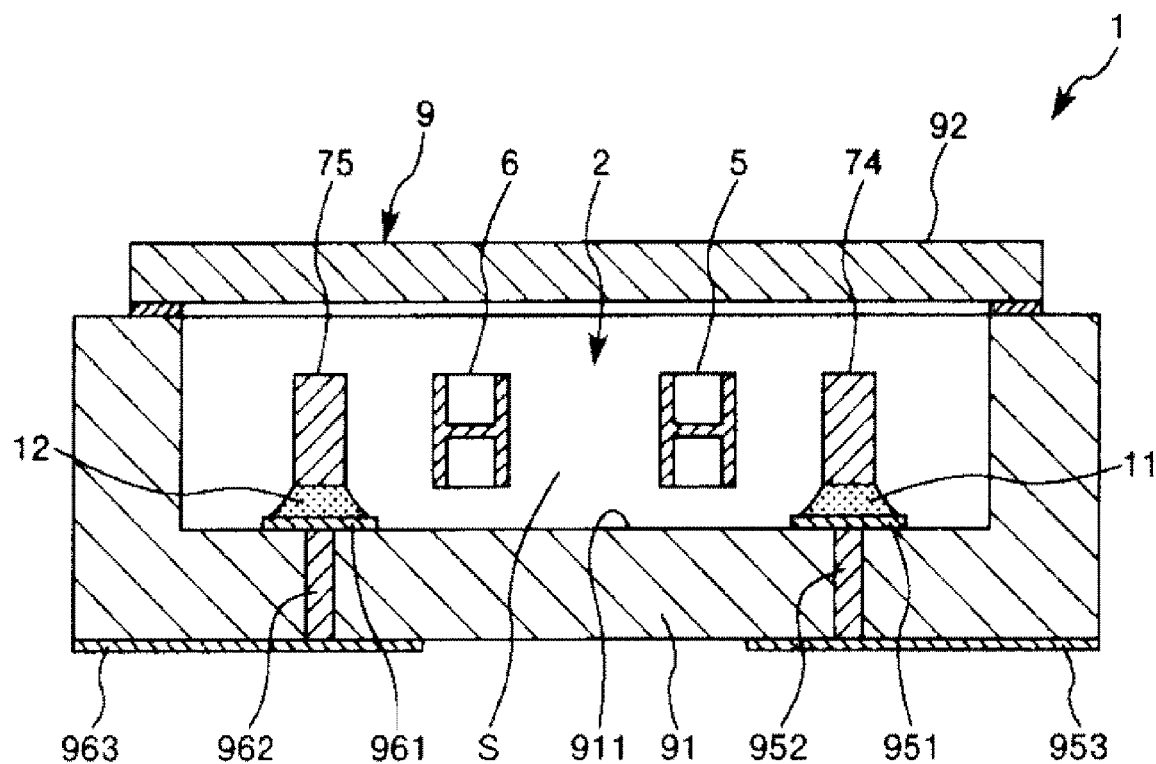
FIG. 2 is a cross-sectional view taken along line A-A in FIG. 1.
Figure 3:
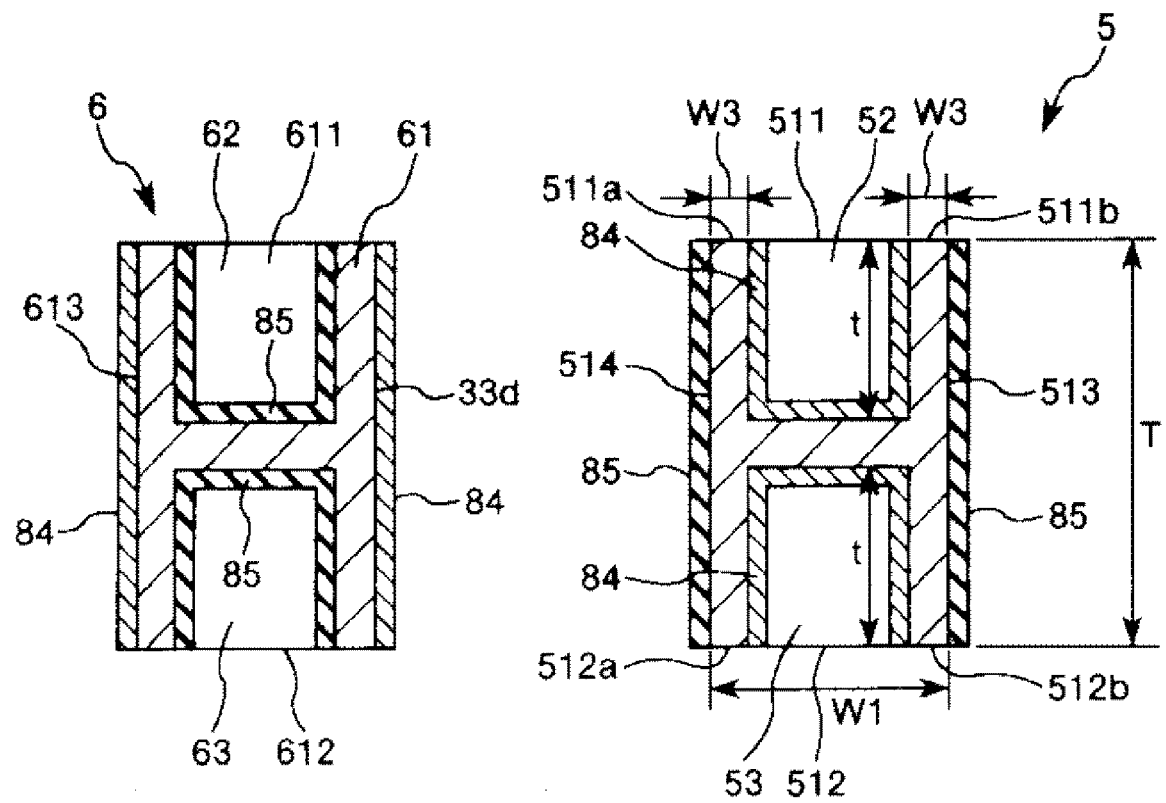
FIG. 3 is a cross-sectional view taken along line B-B in FIG. 1.
Figure 4:
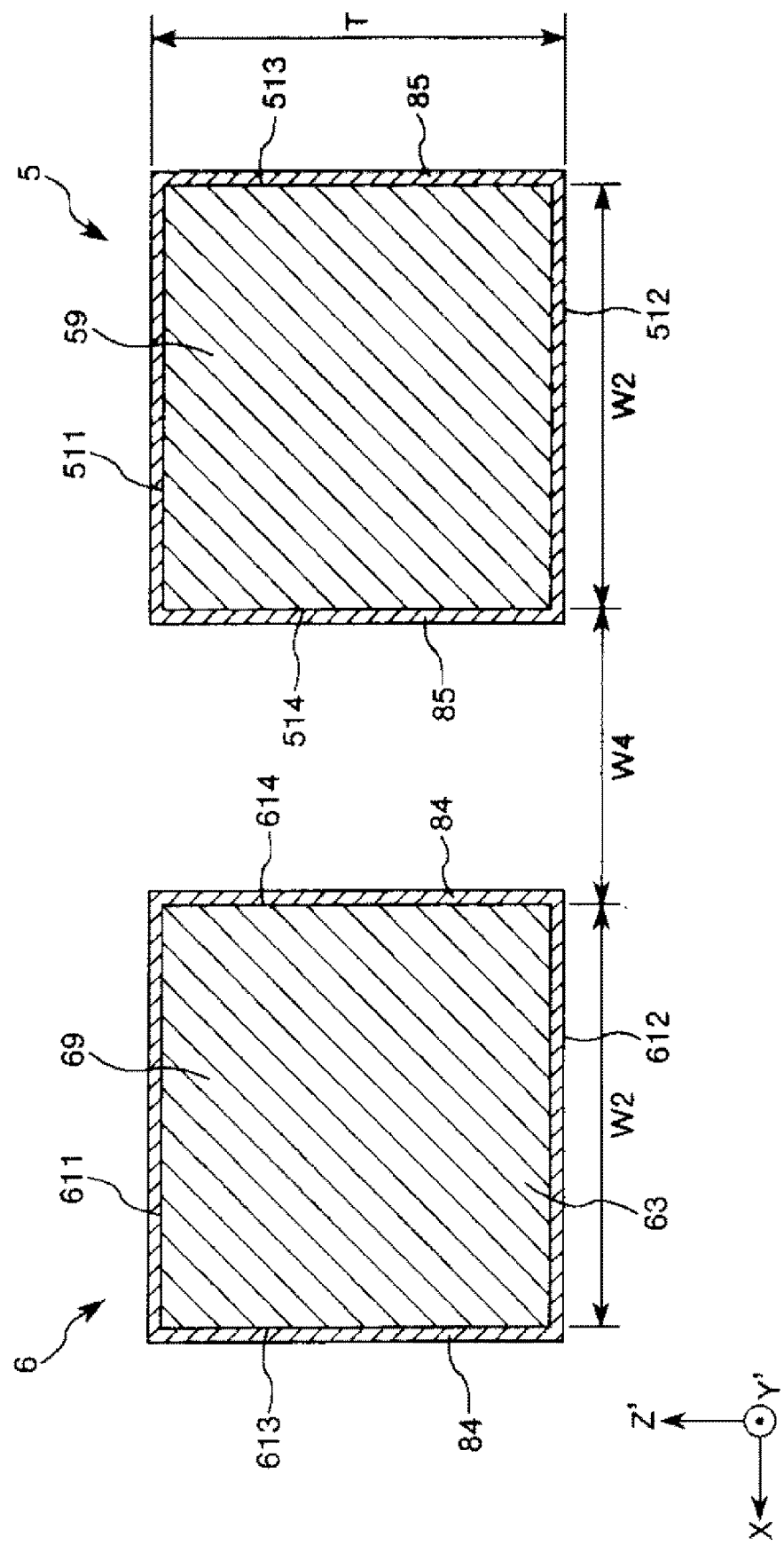
FIG. 4 is a cross-sectional view taken along line C-C in FIG. 1.
Figure 5:
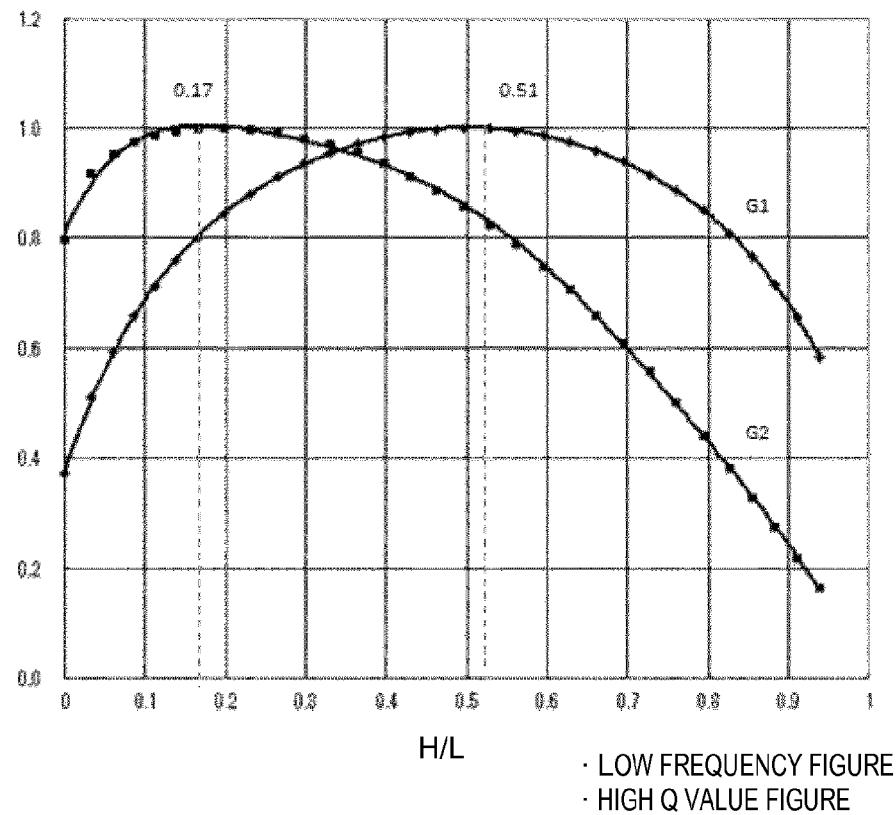
FIG. 5 is a graph illustrating a relationship of H/L and a standardized value.
Figure 6:
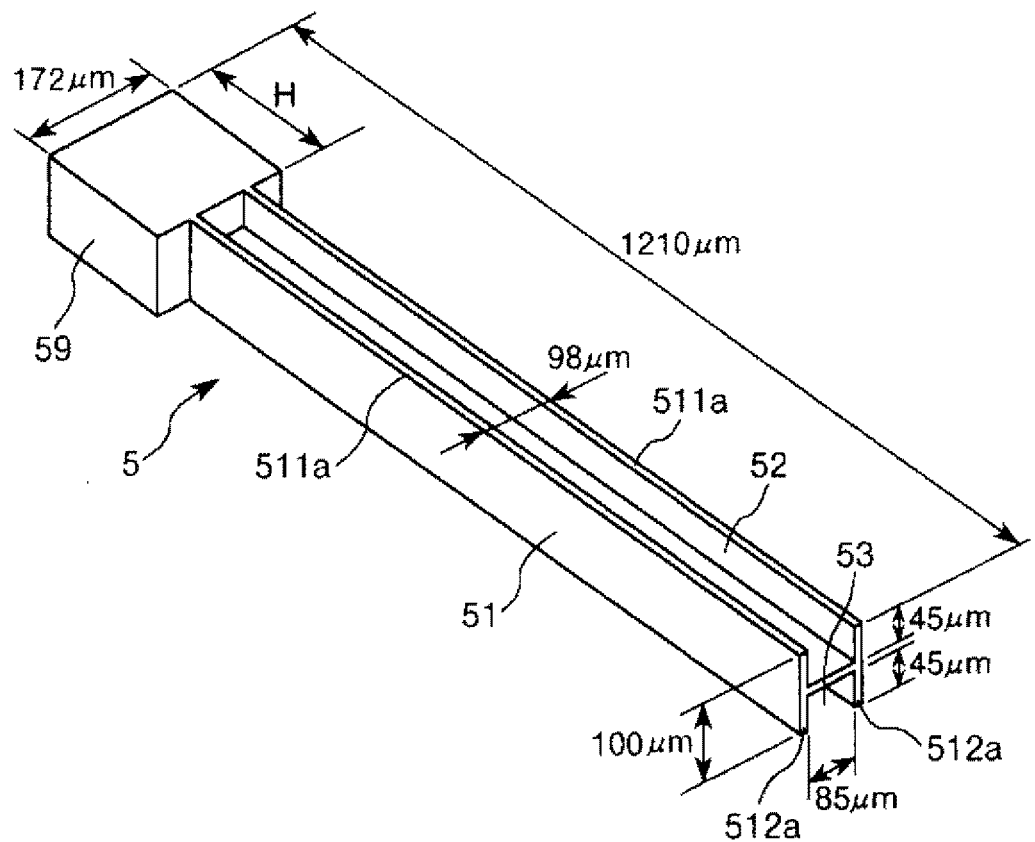
FIG. 6 is a perspective view illustrating the shape and the size of a vibrating arm used in simulation.
Figure 7:
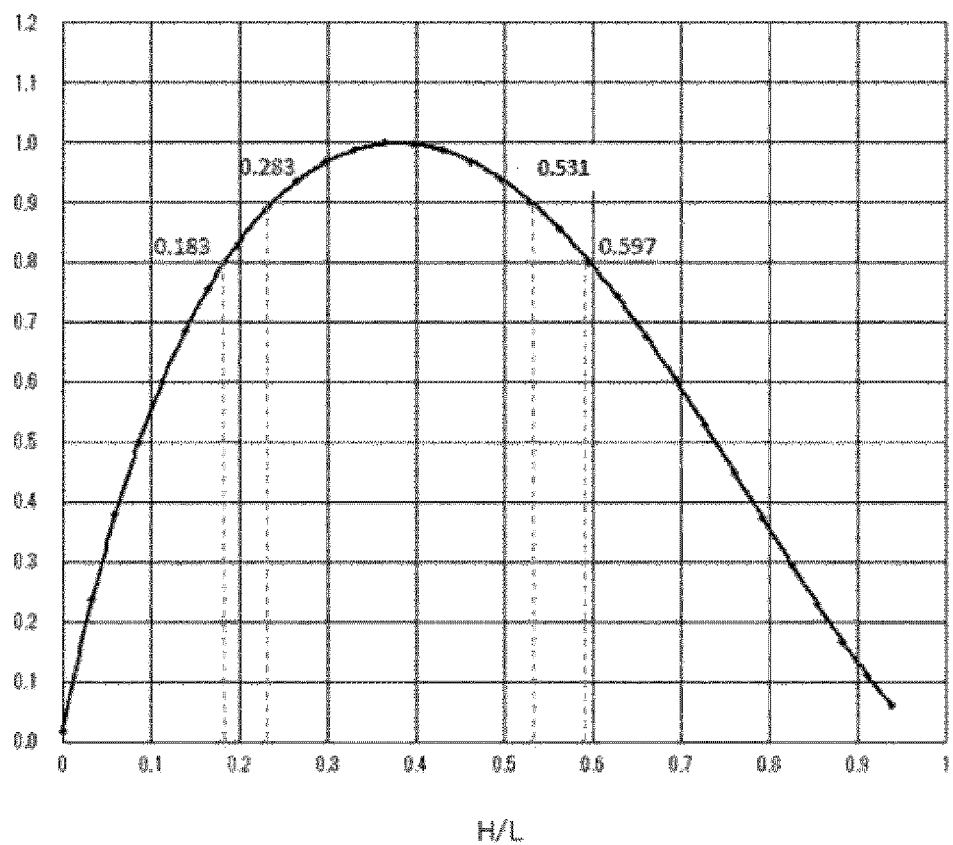
FIG. 7 is a graph illustrating a relationship of H/L and 1 of a high performance figure.
Figure 8A:
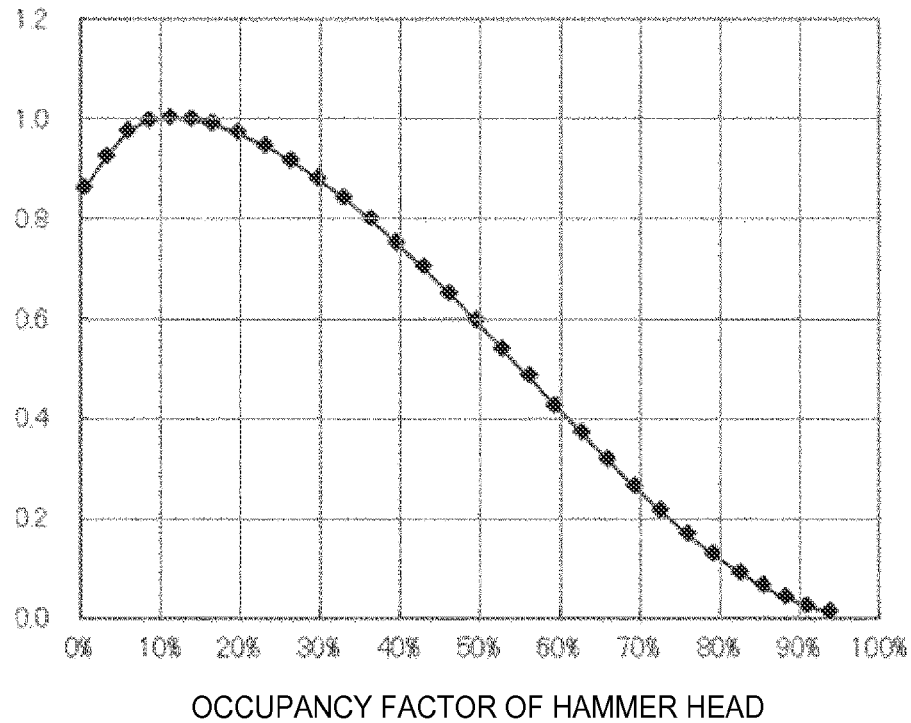
FIGS. 8A and 8B are graphs illustrating a relationship of an occupancy factor of a hammer head and a low R1 figure.
Figure 8B:
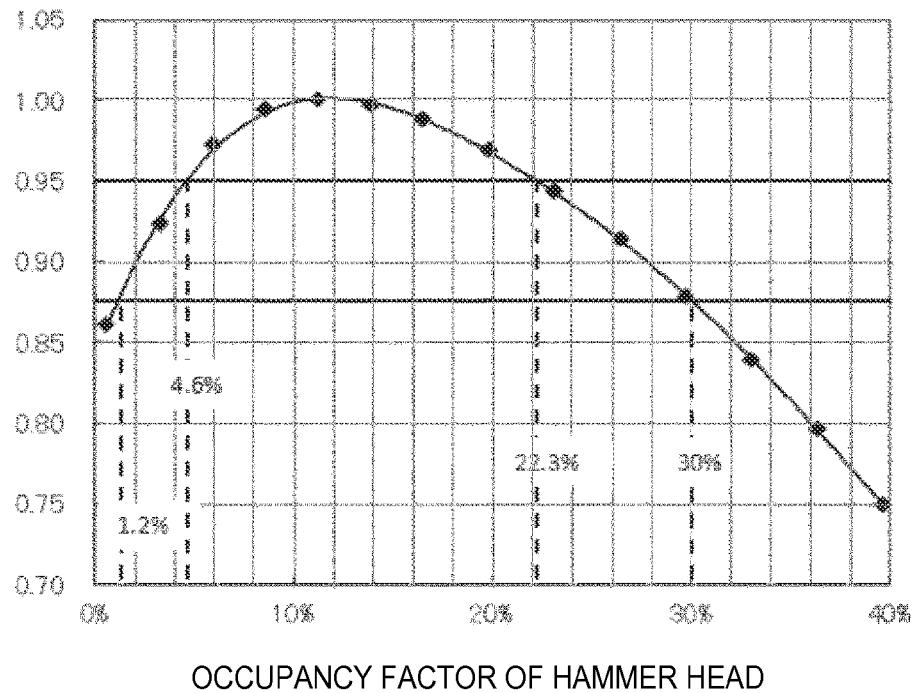
Figure 9:
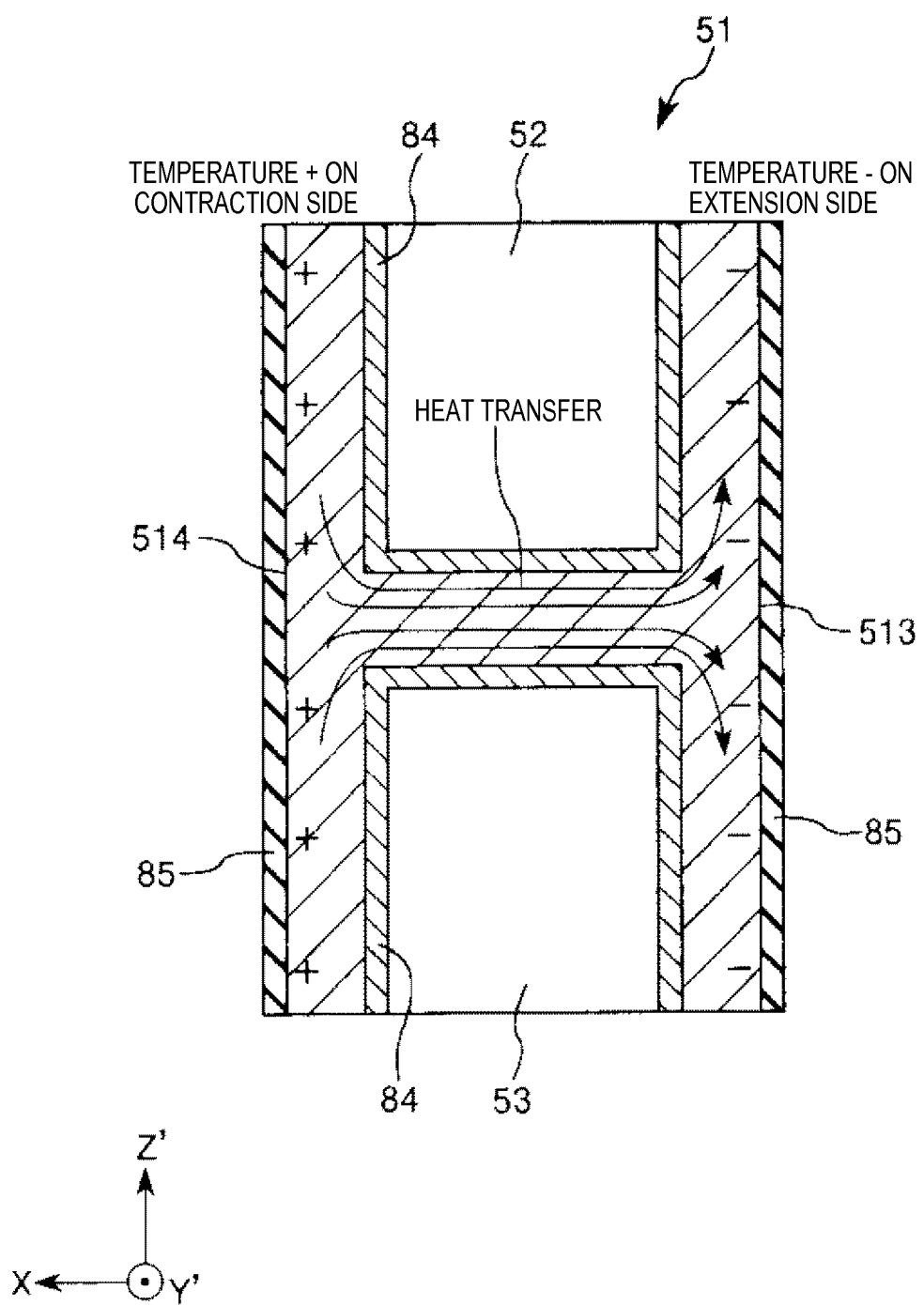
FIG. 9 is a cross-sectional view of the vibrating arm for describing thermal conductivity in flexural vibration.
Figure 10:
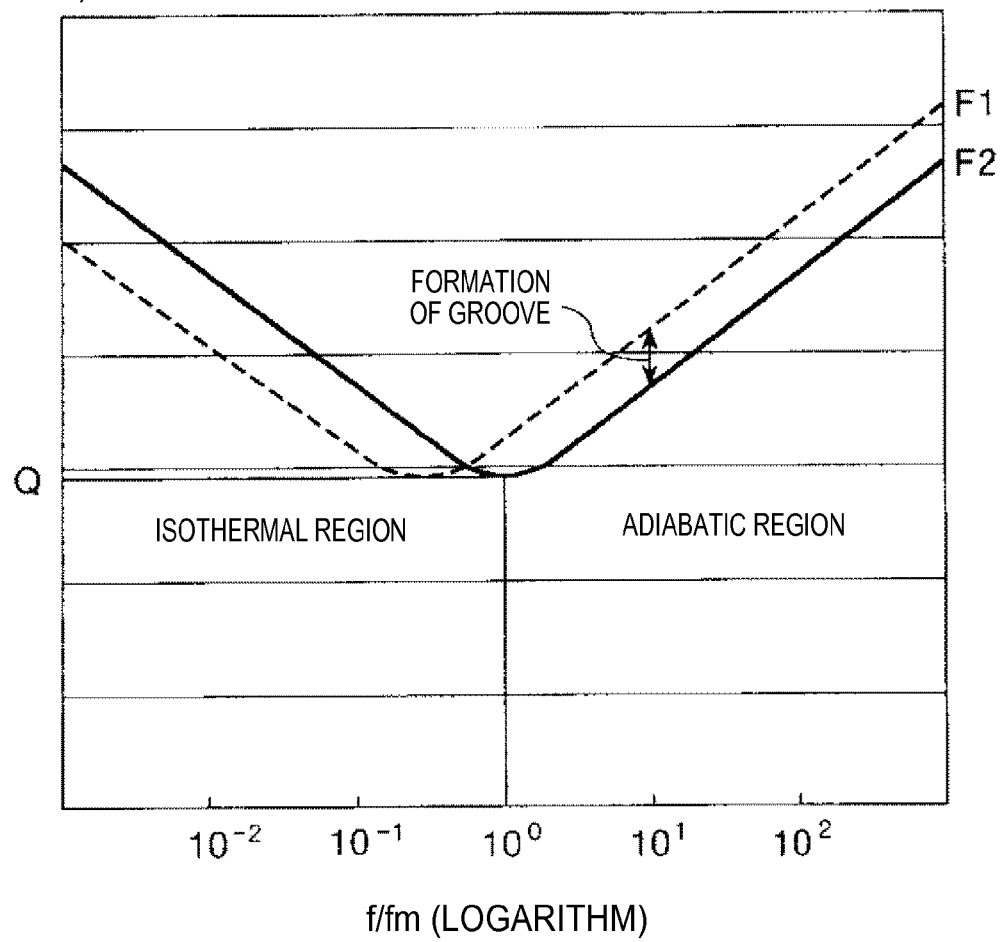
FIG. 10 is a graph illustrating a relationship of a Q value and f/fm.
Figure 11:
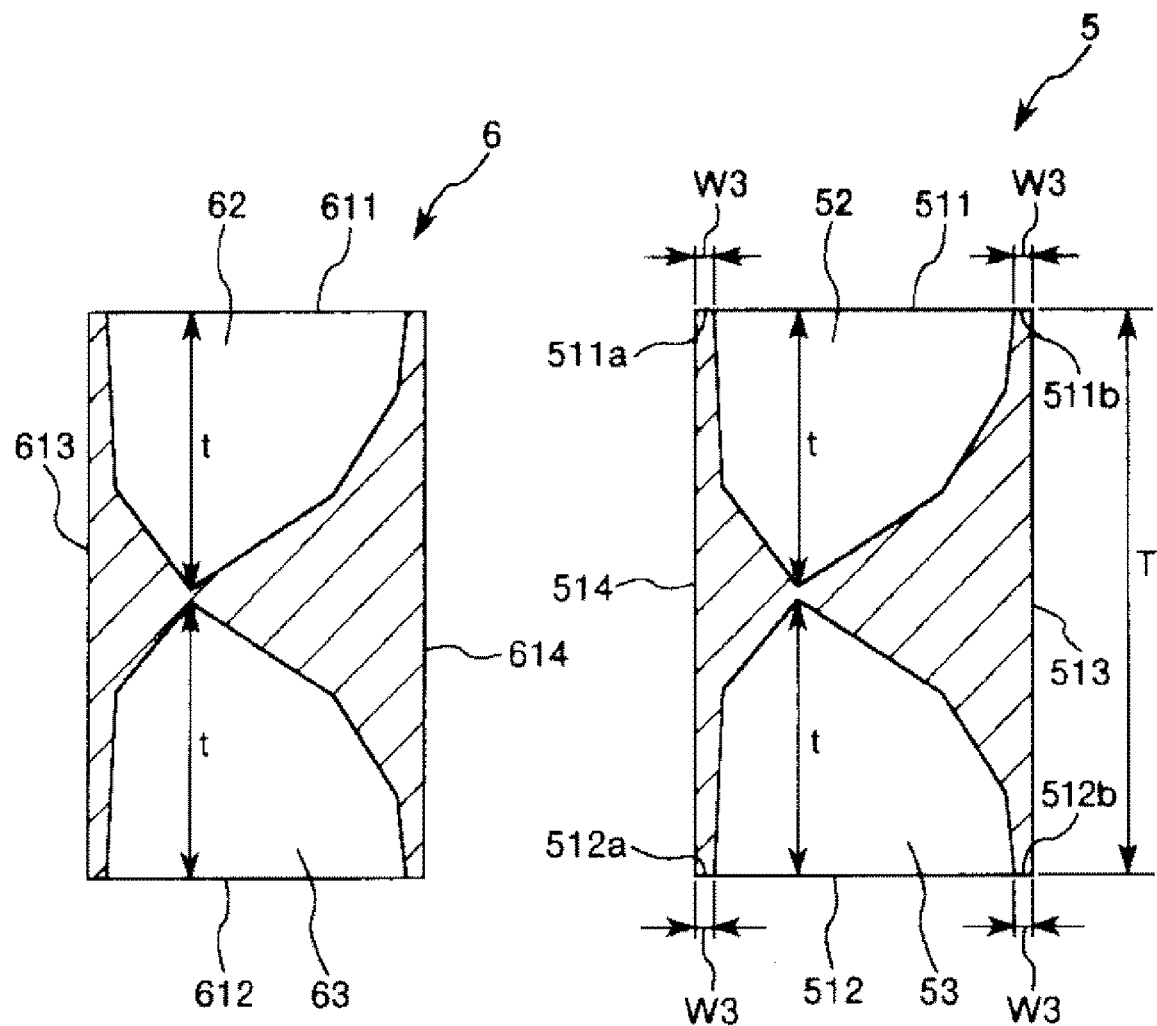
FIG. 11 is a cross-sectional view illustrating the vibrating arm formed by wet-etching.
Figure 12:
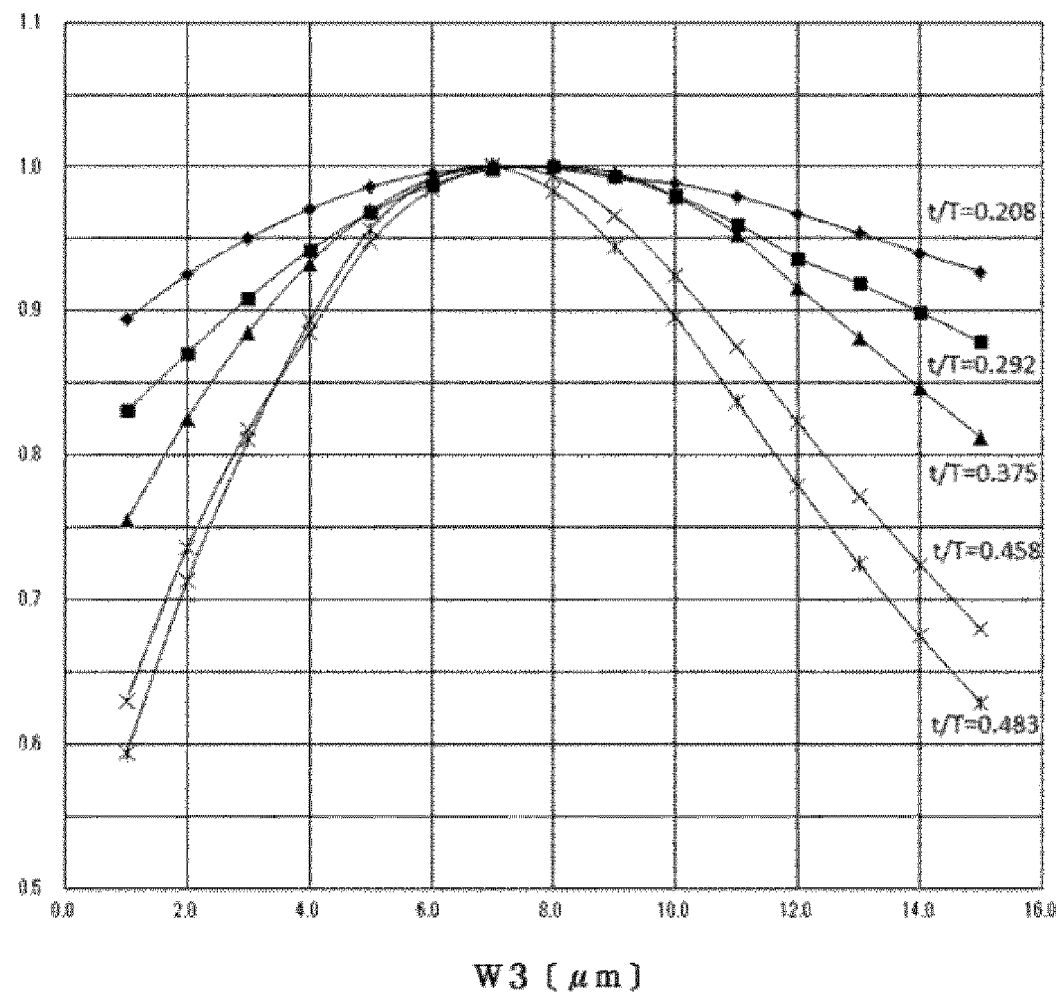
FIG. 12 is a graph illustrating a relationship of W3 and 2 of the high performance figure.
Figure 13:
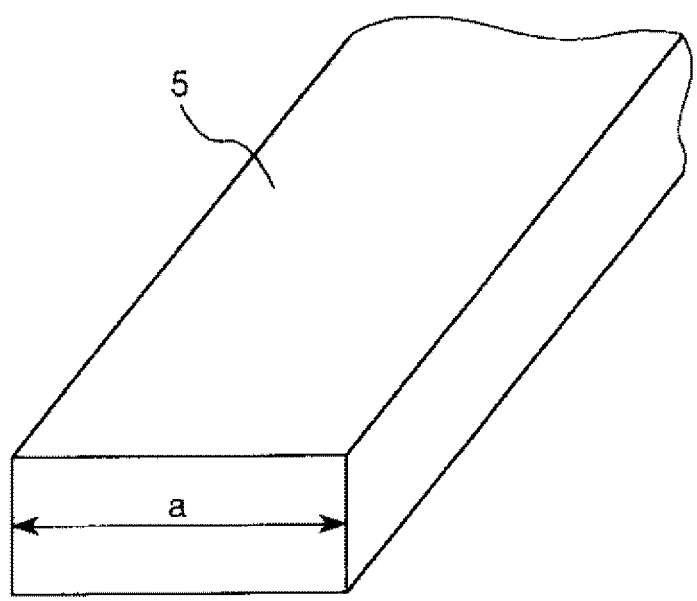
Figure 14:
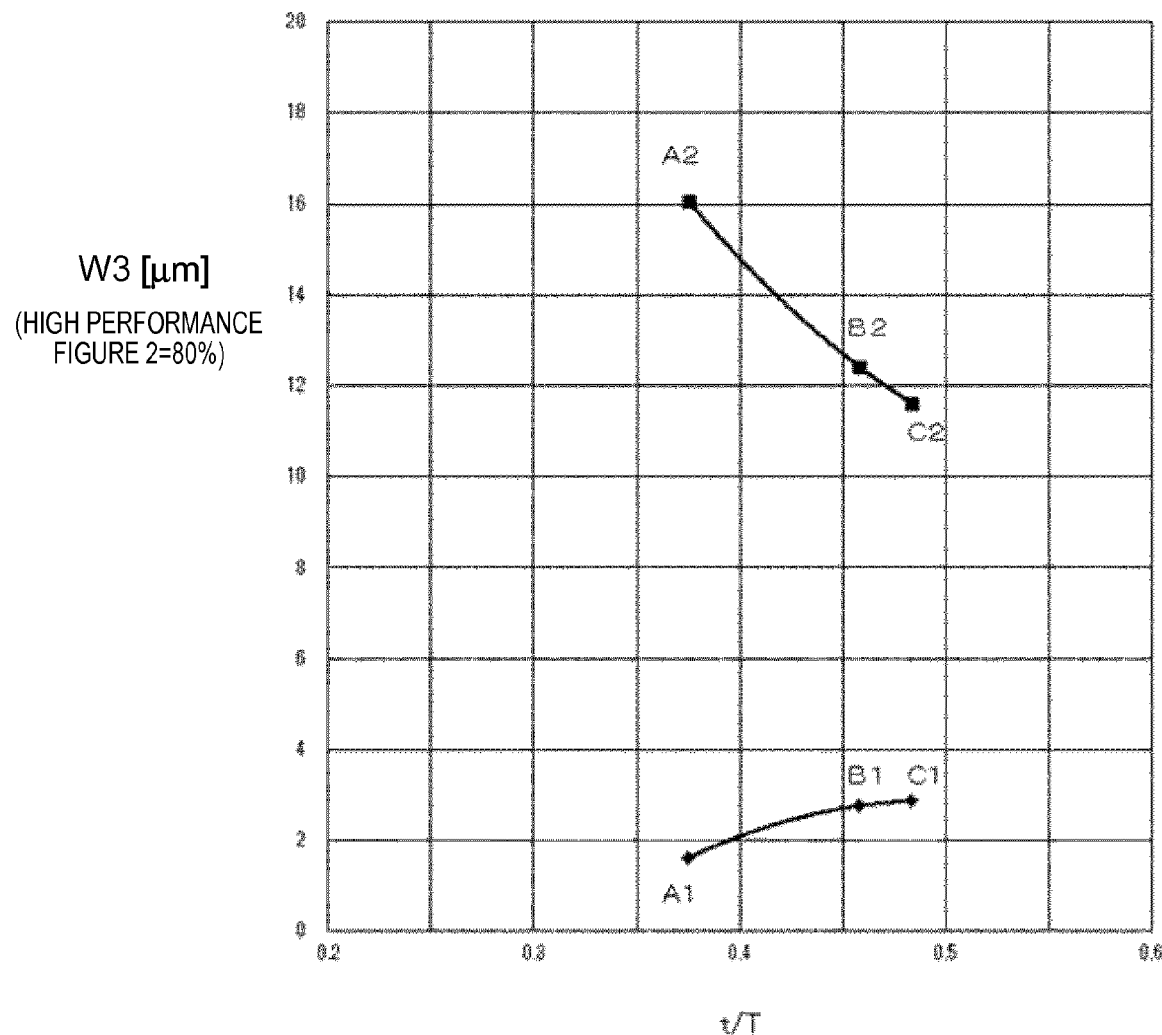
FIG. 14 is a graph illustrating a relationship of H/L and W3.
Figure 15:
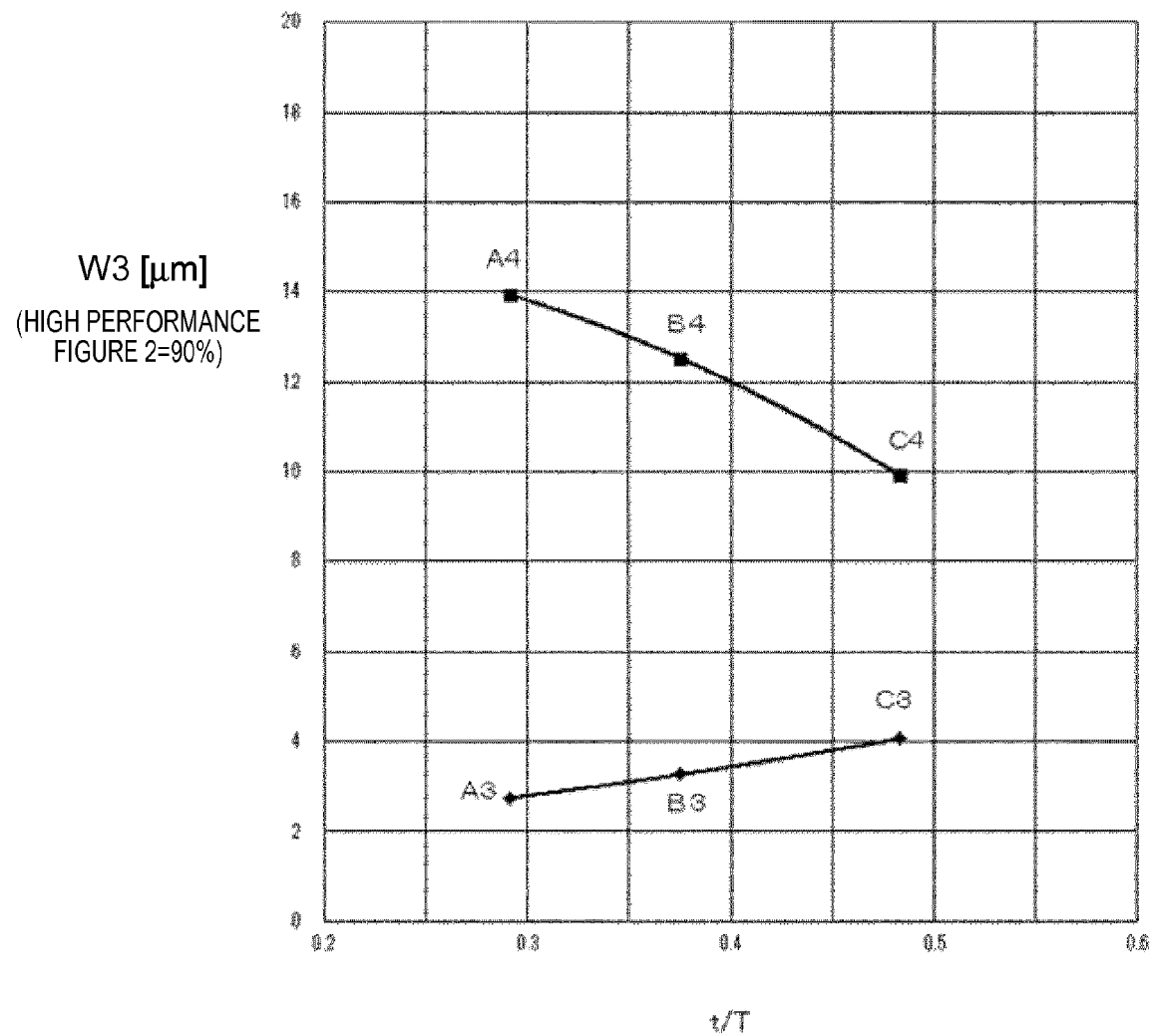
FIG. 15 is a graph illustrating a relationship of H/L and W3.
Figure 16:
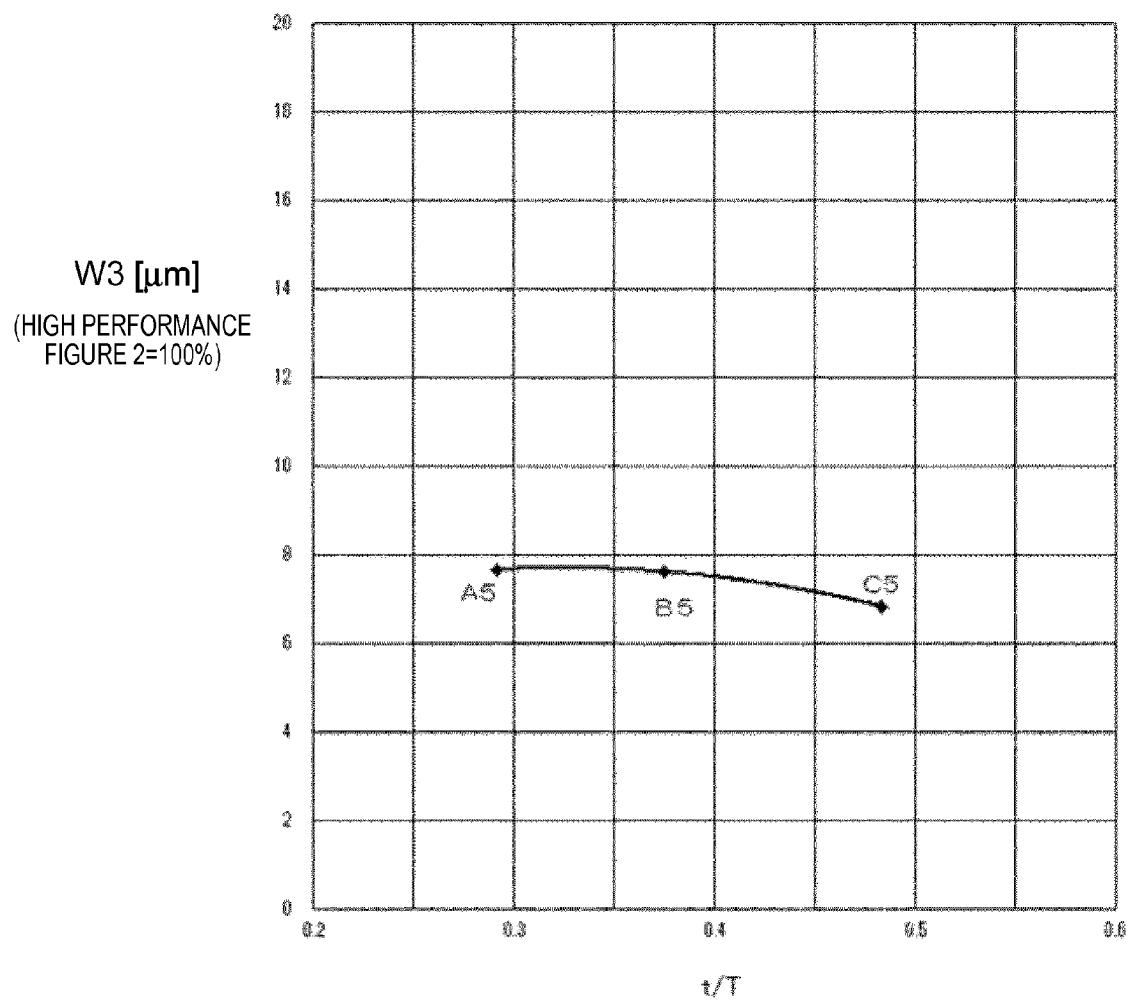
FIG. 16 is a graph illustrating a relationship of H/L and W3.
Figure 17:
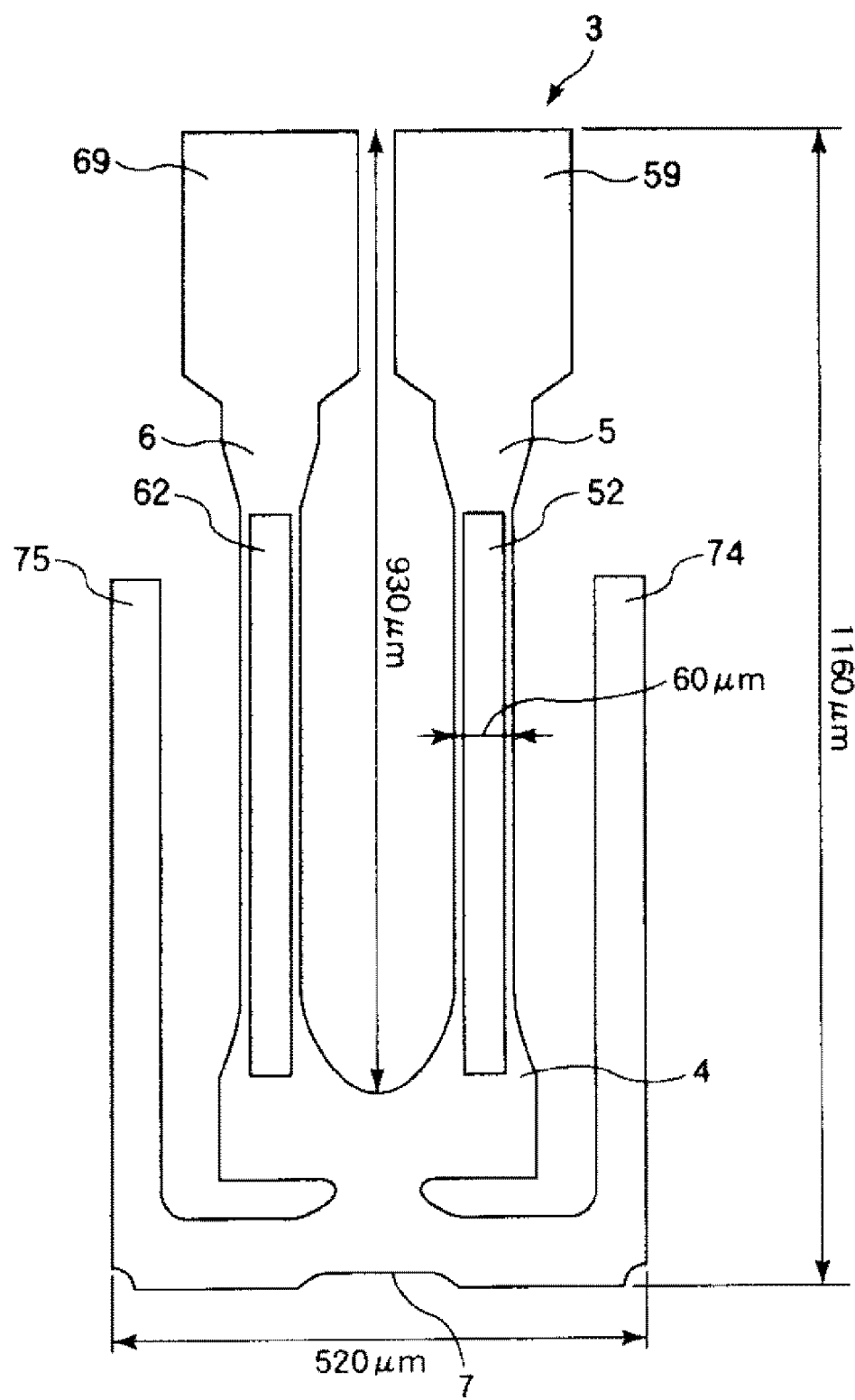
FIG. 17 is a plan view illustrating the shape and size of the resonator element used in simulation.
Figure 18:
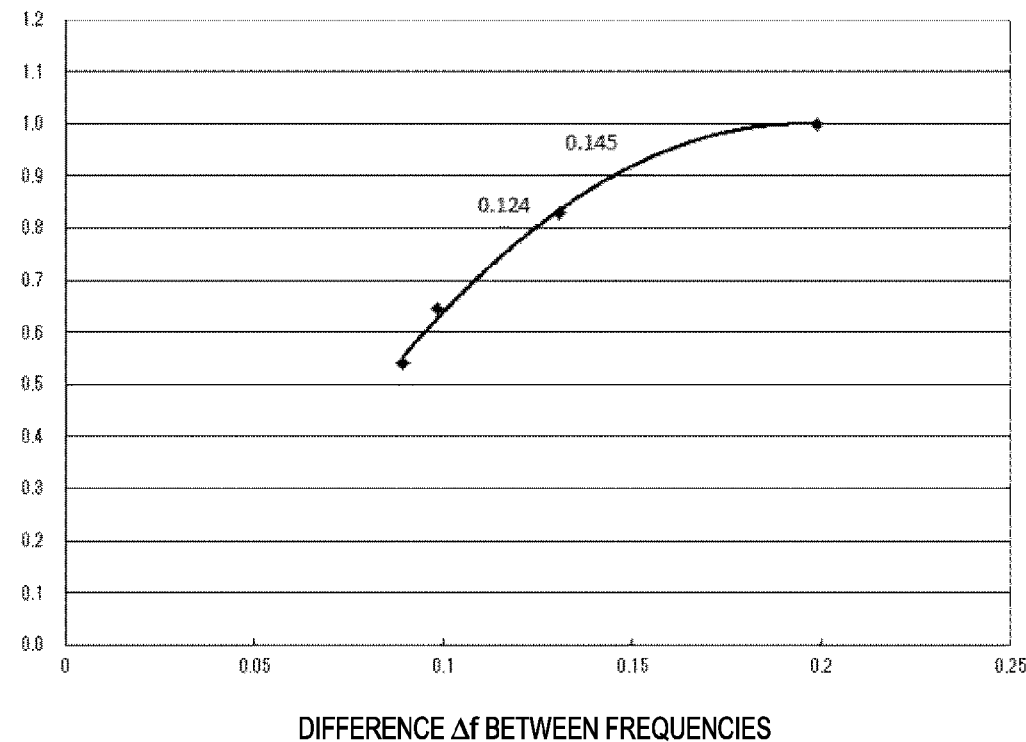
FIG. 18 is a graph illustrating a relationship of Δf and 3 of the high performance figure.
Figure 19:
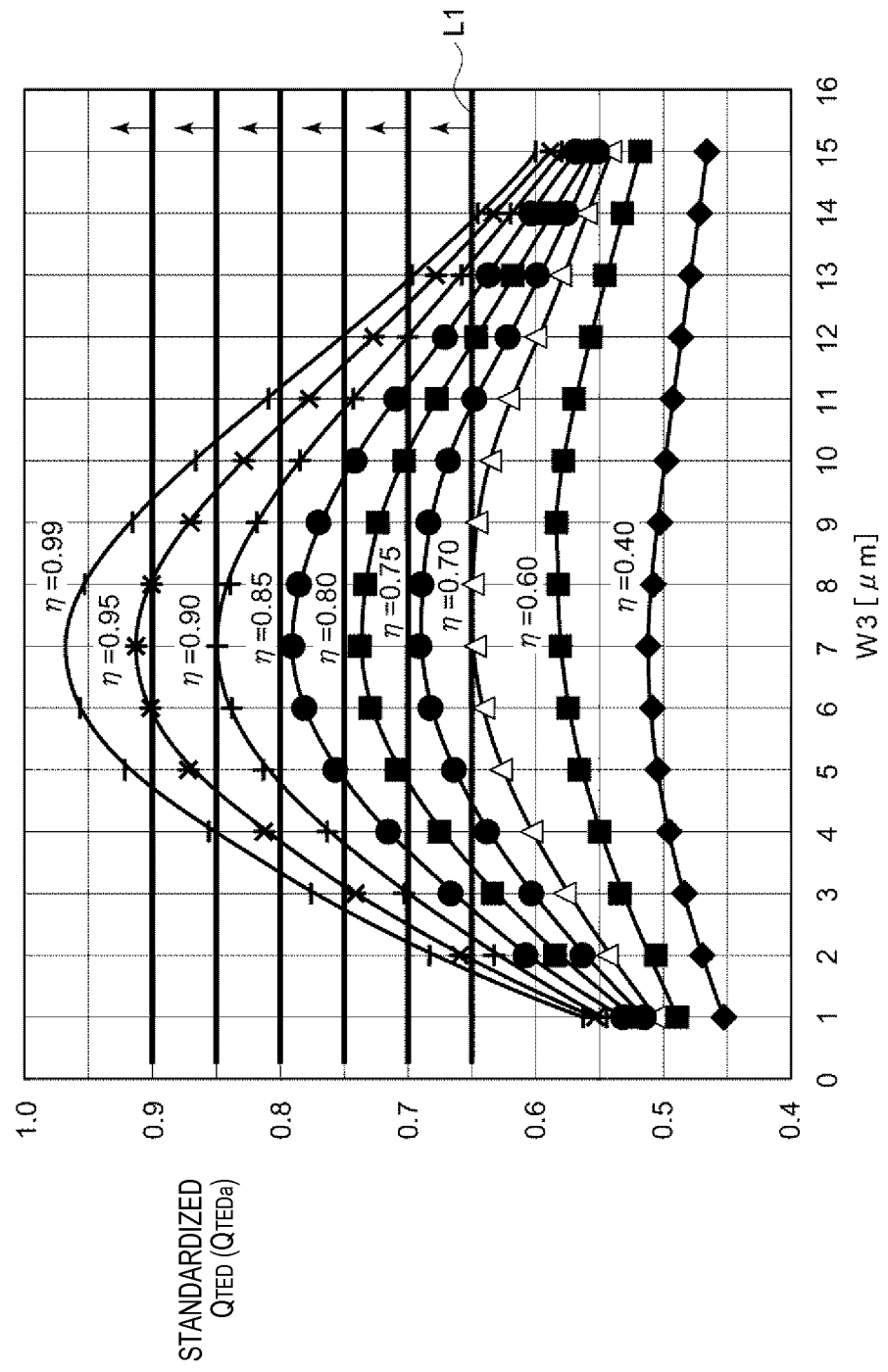
Figure 20:
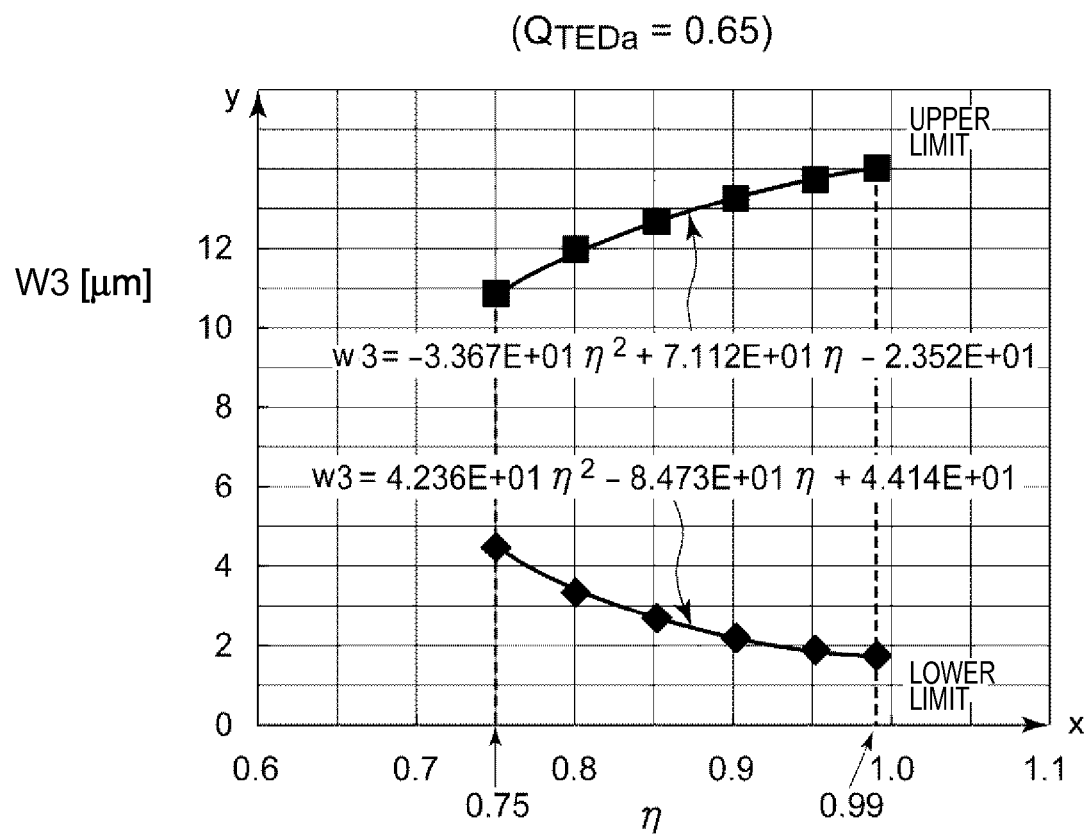
FIG. 20 is a graph illustrating a relationship of η and W3.

FIG. 1 is a plan view of the resonator according to a first embodiment of the invention. FIG. 2 is a cross-sectional view taken along line A-A in FIG. 1. FIG. 3 is a cross-sectional view taken along line B-B in FIG. 1. FIG. 4 is a cross-sectional view taken along line C-C in FIG. 1. FIG. 5 is a graph illustrating a relationship of H/L and a standardized value. FIG. 6 is a perspective view illustrating the shape and size of a vibrating arm obtained by using simulation. FIG. 7 is a graph illustrating a relationship of H/L and 1 of a high performance figure. FIG. 8 is a graph illustrating a relationship of an occupancy factor of a hammer head and a low R1 figure. FIG. 9 is a cross-sectional view of the vibrating arm for describing thermal conductivity in flexural vibration. FIG. 10 is a graph illustrating a relationship of a Q value and f/fm. FIG. 11 is a cross-sectional view illustrating the vibrating arm formed by wet-etching. FIG. 12 is a graph illustrating a relationship of W3 and 2 of the high performance figure. FIG. 13 is a perspective view describing an effective width a. FIGS. 14 to 16 are graphs respectively illustrating a relationship of H/L and W3. FIG. 17 is a plan view illustrating the shape and size of the resonator element obtained by using simulation. FIG. 18 is a graph illustrating a relationship of Δf and 3 of the high performance figure. FIG. 19 is a graph illustrating a relationship of W3 and $Q_{TED}$a. FIG. 20 is a graph illustrating a relationship of η and W3. FIGS. 21 to 25 are graphs respectively illustrating a relationship of η and W3.

For convenient description, three axes orthogonal to each other are assumed below to be an X axis (electrical axis of a quartz crystal), a Y axis (mechanical axis of the quartz crystal), and a Z axis (optical axis of the quartz crystal), as illustrated in FIG. 1. An upper side of FIG. 2 is assumed to be "UP", and a lower side of FIG. 2 is assumed to be "DOWN". An upper side of FIG. 1 is assumed to be a "tip end", and a lower side of FIG. 1 is assumed to be a "proximal end".

The resonator 1 includes a resonator element (the resonator element according to the invention) 2, and a package 9 storing the resonator element 2, as illustrated in FIG. 1.

Package

As illustrated in FIGS. 1 and 2, the package 9 includes a box-shaped base 91 having a concave portion 911 of which an upper surface opens, and a plate-shaped lid 92 which closes an opening of the concave portion 911, and is bonded to the base 91. The package 9 has an accommodation space S formed by the closed concave portion 911 with the lid 92, and the resonator element 2 is accommodated in the accommodation space S in an airtight state. The accommodation space S may be in a decompression (preferably, vacuum) state, or may be sealed with an inert gas such as nitrogen, helium, argon.

A component material of the base 91 is not particularly limited, but various ceramics such as aluminum nitride may be used. A component material of the lid 92 is not particularly limited, but a member may be used which is formed of a material having an approximate coefficient of linear expansion of the component material of the base 91. For example, it is preferable that an alloy of kovar and the like be used when the above-mentioned ceramics is used as the component material of the base 91. Bonding of the base 91 and the lid 92 is not particularly limited; for example, the bonding may be performed through a metallized layer.

Connection terminals 951 and 961 are formed on a bottom surface of the concave portion 911 of the base 91. Two first conductive adhesives (fixation member) 11 are provided on the connection terminal 951, and two second conductive adhesives (fixation member) 12 are provided on the connection terminal 961. The resonator element 2 is attached to the base 91 through the first and second conductive adhesives 11 and 12. The connection terminal 951 is electrically connected to a first driving electrode 84 to be described later, and the connection terminal 961 is electrically connected to a second driving electrode 85. The first and second conductive adhesives 11 and 12 are not particularly limited as long as they have conductivity and adhesive property, for example, may be used as a conductive adhesive obtained by mixing a conductive filler such as silver particles with resin which is epoxy-based, acryl-based, silicon-based, polyimide-based, bismale-imide-based, polyester-based, and polyurethane-based.

The connection terminal 951 is electrically connected to an external terminal 953 provided on a lower surface of the base 91 via a through electrode 952 which penetrates the base 91. Similarly, the connection terminal 961 is electrically connected to an external terminal 963 provided on the lower surface of the base 91 via a through electrode 962 which penetrates the base 91. The connection terminals 951 and 961, the through electrodes 952 and 963, and the external terminals 953 and 963 are not particularly limited as long as having conductivity in view of configuration, for example, may be configured with a metal film obtained by layering a film formed of Au (gold), Ag (silver), Cu (copper), and the like on a base layer formed of Cr (chrome), Ni (nickel), W (tungsten), and the like.

Resonator Element

As illustrated in FIGS. 1 and 3, the resonator element 2 includes a quartz crystal resonator blank (vibration substrate) 3, and the first and second driving electrodes 84 and 85 formed on the quartz crystal resonator blank 3. For convenient description, the first and second driving electrodes 84 and 85 are not illustrated in FIGS. 1 and 2.

The quartz crystal resonator blank 3 is configured with a Z cut quartz crystal plate. The Z cut quartz crystal plate means a quartz crystal substrate where a Z axis of the quartz crystal plate is set to be a thickness direction. The Z axis may match a thickness direction of the quartz crystal resonator blank 3, but the Z axis in this embodiment is slightly inclined to the thickness direction in view of a small frequency-temperature variation in the vicinity of room temperature.

That is, when an inclined angle is set to θ degrees (for example, $-5° \leq \theta \leq 15°$), if an orthogonal coordinate system is configured with the X axis as an electrical axis of the quartz crystal, the Y axis as a mechanical axis of the quartz crystal, and the Z axis as an optical axis of the quartz crystal, a Z' axis is set to the Z axis inclined by θ degrees in order for the +Z side thereof to rotate toward the −Y direction of the Y axis, and a Y' axis is set to the Y axis inclined by the θ degree in order for the +Y side thereof to rotate toward the +Z direction of the Z axis using the X axis of the orthogonal coordinate system as a rotation axis, the quartz crystal resonator blank 3 is formed in which a direction along the Z' axis is set to a thickness direction, and a surface including the X axis and the Y' axis is set to a main surface, as illustrated in FIG. 1 and the like.

In the quartz crystal resonator blank 3, the Y' axis is set to be a longitudinal direction (first direction), the X axis is set to be a width direction (second direction), and the Z' axis is set to be a thickness direction among the X axis, the Y' axis and the Z' axis which are orthogonal to each other.

The quartz crystal resonator blank 3 includes a base 4, a pair of vibrating arms 5 and 6, a connection portion 72 disposed on the +Y' axial side of the base 4 and extending in the X axial direction, a joining portion 71 positioned between the base 4 and the connection portion 72 to join the base 4 and the connection portion 72, and a pair of holding arms 74 and 75 extending from both ends of the joining portion 71 toward the −Y' axial direction.

The base 4 has a plate shape which is widespread in an XY' plane, and has a thickness in the Z' axial direction. The joining portion 71 extends from an end of the base 4 on the +Y' axial side toward the +Y' axial direction. The connection portion 72 is connected to an end of the joining portion 71 on the +Y' axial side, and extends from the joining portion 71 toward both sides of the X axial direction. The holding arm 74 extends from an end of the joining portion 71 on the −X axial side toward the −Y' axial direction, and the holding arm 75 extends from an end of the joining portion 71 on the +X axial side toward the −Y' axial direction. The holding arms 74 and 75 are disposed outside the vibrating arms 5 and 6, and the vibrating arm 5 and 6 are disposed between the holding arm 74 and 75. Tip ends of the holding arm 74 and 75 (ends on the −Y' axial side) are disposed on the +Y' axial side of tip ends of the vibrating arm 5 and 6 (ends on the −Y' axial side).

The vibrating arm 5 and 6 line up in the X axial direction, and extend from the end of the base 4 on the −Y' axial side toward −Y' axial direction so as to be parallel to each other. Each of the vibrating arm 5 and 6 has a longitudinal shape, a proximal end (end on the +Y' axial side) as a fixed end, and a tip end (end on the −Y' axial side) as a free end. The vibrating arm 5 and 6 respectively have arms 51 and 61, and hammer heads (wide width portion) 59 and 69 which are respectively disposed at tip ends of the arms 51 and 61, and are weight portions of which the length is greater than that of the arms 51 and 61 in the X axial direction.

As illustrated in FIG. 3, the arm 51 has a pair of main surfaces 511 and 512 having a relationship of the front and back, and a pair of side surfaces 513 and 514 connected to the pair of main surfaces 511 and 512, the main surfaces 511 and 512 are configured in the XY' plane, and the side surfaces 513 and 514 are configured in the Y'Z' plane. A groove 52 and a groove 53 are provided in the arm 51, the groove 52 has a bottom and opens in the main surface 511, and the groove 53 has a bottom and opens in the main surface 512. In this manner, the grooves 52 and 53 are formed in the vibrating arm 5, and thus it is possible to reduce thermoelastic loss, and to have excellent vibrating characteristics. The lengths of the grooves 52 and 53 are not particularly limited, tip ends thereof may extend to the hammer head 59, and proximal ends thereof may extend to the base 4. With such a configuration, stress concentration is reduced at a boundary portion of the arm 51 and the hammer head (weight portion) 59, and a boundary portion of the arm 51 and the base 4, and concerns of a break or a cut-out occurring when an impact is given are reduced.

When the depth of the grooves 52 and 53 are set to be t [μm], the thickness of the vibrating arm 5 and 6 are set to be T [μm], and it is preferable that a relationship of $0.292 \leq t/T \leq 0.483$ be satisfied with respect to the depth t. The relationship is satisfied, a heat transfer path lengthens, and thus it is possible to further effectively reduce the thermoelastic loss in an adiabatic-like region which will be described later. In addition, it is further preferable that a relationship of $0.455 \leq t/T \leq 0.483$ be satisfied with respect to the depth t. The relationship is satisfied, the heat transfer path further lengthens, and thus it is possible to reduce the thermoelastic loss. Accordingly, it is realized that a Q value increases, a CI value is reduced depending on an increase of the Q value, and the reduced CI value is realized such that it is possible to widen an electrode area for applying an electric field in a region occurring flexural deformation.

It is preferable that the grooves 52 and 53 be formed by adjusting positions thereof in the X axial direction with respect to the vibrating arm 5 such that the center of the vibrating arm 5 in cross section matches the center of the cross-sectional shape of the vibrating arm 5, and thus unnecessary vibration of the vibrating arm 5 (specifically, inclined vibration having a component of a direction out of a plane) is reduced. Accordingly, it is possible to reduce vibration leakage. In this case, driving of gratuitous vibration is also reduced, and thus it is possible to relatively widen a driving area and lessen the CI value.

The width W1 of the arm 51 is not limited. However, it is preferable that the width W1 of the arm 51 be in a range of approximately 16 μm to 300 μm. If the width W1 is less than a lower limit value, in a manufacturing technique, it is difficult to form the grooves 52 and 53 in the arm 51, and thus it is impossible to use the vibrating arm 5 as the adiabatic-like region in some cases. Meanwhile, if the width W1 exceeds an upper limit value, the hardness of the arm 51 excessively increase due to a value of the thickness T, and thus it is impossible to smoothly perform flexural vibration of the arm 51 in some cases.

The hammer heads 59 and 69 will be described, which are respectively formed in the tip ends of the arms 51 and 62.

The hammer heads 59 and 69 are provided near each other as close as possible to the extent that the hammer heads 59 and 69 are not brought into contact with each other when the resonator element 2 vibrates at a desired flexural vibration frequency, and thus are formed to realize the quartz crystal resonator blank 3 having a reduced size and high performance. The hammerheads 59 and 69 are provided, and thus it is possible to shorten the entire length of the vibrating arm 5 and 6, which results in reduction of vibrating displacement, and thus it is possible to reliably suppress or reduce a collision between the hammer heads 59 and 69. This effect is greatly achieved when the vibrating arms 5 and 6 vibrate with comparatively high power and the vibrating displacement increases.

When the lengths of the vibrating arm 5 and 6 are constant, if a resonance frequency which is lowered by providing the hammer heads 59 and 69 in tip end portions of the arms 51 and 61 is maintained to be the same as a resonance frequency when the hammer heads 59 and 69 are not provided because the length (width) of the arms 51 and 61 in the second direction (X axial direction) becomes large, a path becomes long, and the path through which heat which is generated in the arms 51 and 61 during the flexural vibration flows in the second direction of the arms 51 and 61 (X axial direction). Accordingly, it is possible to increase the Q value and decrease the CI value by reducing the thermoelastic loss in the adiabatic-like region, as will be described later.

The hammer head 59 and the hammer head 69 are provided in the invention in such a manner that a relationship of $0.033 \times T$ (μm) $\leq W4 \leq 0.33 \times T$ (μm) is satisfied by a distance W4 (see in FIG. 1 and FIG. 4) between the hammer heads 59 and 69 in the X axial direction. When the quartz crystal resonator blank 3 is formed using photolithography technique and wet-etching technique, a relationship of the distance W4 between the hammer heads 59 and 69 and the thickness T of the vibrating arms 5 and 6 (hammer heads 59 and 69) is optimized by satisfying the relationship, as will be described later. As a result, the quartz crystal resonator blank (quartz crystal substrate) 3 is formed in which micro-minimization is realized.

A calculating method of the relationship expression will be described below.

Here, time necessary for penetration of a Z cut quartz crystal plate having a plate thickness T (μm) by wet-etching is set to t1 (minute), a time taken to actually process the Z cut quartz crystal plate is set to t2 (minute), and a predetermined coefficient is set to k. If an amount when the Z cut quartz crystal plate is etching in the ±X axial direction in the time t2 (amount of side etching) is summed to be set to ΔX (μm), ΔX can be represented by $\Delta X = t2/t1 \times T \times k$. In this expression, when t1=t2, an expression of $\Delta X = T \times k$ (Expression 1) is established.

Actually, etching is performed from the main surfaces of the front and back until the Z cut quartz crystal plate having a thickness of T=100 (μm) is penetrated, and wet-etching is ended at the time point of penetration. When ΔX is measured at that time, ΔX is 1.63 (μm). k=0.0163 is calculated by applying this actual measurement value to (Expression I). When this is converted to a case where wet-etching is performed from one main surface, k=0.0326 is calculated.

When the resonator element 2 is made, it is preferable that a relationship of $2 \leq t2/t1 \leq 30$ (Expression 2) be satisfied such that the cross-sectional shapes of the vibrating arm 5 and 6 (hammer heads 59 and 69) are high symmetric, and thus the vibration leakage is suppressed. When the wet-etching is performed from the main surfaces of the front and back, a relationship of $0.033 \times T$ (μm) $\leq W4 \leq 0.489 \times T$ (μm) is obtained, and when the wet-etching is performed from one main surface, a relationship of $0.065 \times T$ (μm) $\leq W4 \leq 0.978 \times T$ (μm) is obtained, based on (Expression 2) and (Expression 1).

In view of minimization of the resonator element 2, the wet-etching is performed from the first main surface and the second main surface which have the relationship of the front and back, and thus it is preferable that ΔX be lessened. Accordingly, the relationship expression of $0.033 \times T$ (μm) $\leq W4 \leq 0.489 \times T$ (μm) is drawn, but the upper limit value thereof is set to become small as with $0.033 \times T$ (μm) $\leq W4 \leq 0.33 \times T$ (μm) in the invention. Consequently, micro-minimization of the quartz crystal resonator blank (tuning fork resonator blank) 3 is realized.

It is preferable that a relationship of 50 μm≤T≤140 μm be satisfied by the thickness T of the vibrating arm 5 and 6 (hammer head 59 and 69). Accordingly, it is possible to obtain the quartz crystal resonator blank 3 having a reduced size and a high Q value. Furthermore, it is preferable that a relationship of 110 μm≤T≤140 μm be satisfied by the thickness T. Accordingly, the vibrating arm 5 and 6 becomes thick in the thickness T, an area where vibration can be electrically caused becomes wide compared to when the relationship of 50 μm≤T≤140 μm is satisfied, and thus it is possible to obtain the quartz crystal resonator blank 3 having a reduced size and a low CI value. Since the thickness T is large, it is possible to obtain the quartz crystal resonator blank 3 having excellent impact resistance.

It is preferable that the following expression (1) be satisfied by the hammer heads 59 and 69 when, in the resonator element 2, the entire length of the vibrating arm 5 (length in the Y' axial direction) is set to L, and the entire length of the hammer heads 59 and 69 (length in the Y' axial direction) is set to H.

Here, the hammer head 59 is a region having a width 1.5 times or more with respect to the width of the arm 51 (length in the X axial direction).

$$0.183 \leq \frac{H}{L} \leq 0.597 \quad (1)$$

The effect obtained by the expression (1) being satisfied will be described below based on FIG. 5 and FIG. 6. Since the hammer head 59 and 69 have the same shape, the hammer head 59 will be representatively described below.

FIG. 5 illustrates a curved line G1 and a curved line G2, the curved line G1 is obtained by making a relationship of the length H of the hammer head 59 and the resonance frequency of the vibrating arm 5 be figures, and the curved line G2 is obtained by making a relationship of the length H of the hammer head 59 and the Q value of the vibrating arm 5 be figures. The Q value indicated by the curved line G2 is obtained by taking only the thermoelastic loss into consideration. Below, a vertical axis of the curved line G1 is referred to as "low frequency figure", and a vertical axis of the curved line G2 is referred to "high Q value figure".

Simulation for obtaining the curved lines G1 and G2 is performed by using one piece of the vibrating arm 5. The vibrating arm 5 obtained by using this simulation is configured with a Z quartz crystal plate (rotation angle of 0°). The size of the vibrating arm 5 has the entire length L of 1210 μm and the thickness T of 100 μm, the width W1 of the arm 51 being 98 μm, the width W2 of the hammer head 59 being 172 μm, the depth t of the grooves 52 and 53 together being 45 μm, and the width W3 of bank portions 511a, 511b, 512a, and 512b respectively being 6.5 μm, as illustrated in FIG. 6. In the vibrating arm 5, simulation is performed with changing of the length H of the hammer head 59. It is confirmed by the inventors that a result having tendency similar to that of a simulation result illustrated in the followings is obtained even by changing the size (L, W1, W2, T, t1, t2, and W3) of the vibrating arm 5.

It is meant in FIG. 5 that the resonance frequency of the vibrating arm 5 is the lowest at the point where a standardized value (low frequency figure) is one (H/L=0.51) in the curved line G1, and the Q value of the vibrating arm 5 is the highest at the point where a standardized value (high Q value figure) is one (H/L=0.17) in the curved line G2. As the resonance frequency of the vibrating arm 5 decreases, it is possible to minimize the resonator element 2. Accordingly, it is possible to minimize the resonator element 2 as much as possible in H/L=0.51 (also refer to "Condition 1" below). As the Q value increases, it is possible to decrease the thermoelastic loss, and it is possible to show the excellent vibrating characteristics. Accordingly, it is possible to obtain the resonator element 2 having the most excellent vibrating characteristics in H/L=0.17 (also refer to "Condition 2" below).

However, as also understood from FIG. 5, a high Q value figure is not sufficiently large in H/L=0.51, and a low frequency figure is not sufficiently large in H/L=0.17. Accordingly, it is not possible to obtain the excellent vibrating characteristics in a state where only Condition 1 is satisfied; in contrast, it is not possible to sufficiently minimize the resonator element 2 in a state where only Condition 2 is satisfied.

"High performance FIG. 1" is set as a figure for obtaining the minimization of the resonator element 2 and the improved vibrating characteristics, and a relationship of high performance FIG. 1 and the H/L is illustrated in FIG. 7. [High performance FIG. 1] is represented by [low frequency figure]×[high Q value figure]×[correction value]. High performance FIG. 1 is figures when the largest value thereof is set to 1. [correction value] is a correction value for fitting the simulation performed in one piece of the vibrating arm 5 for the resonator element 2 having two pieces of the vibrating arms 5 and 6. For this reason, it is possible for High performance FIG. 1 to further approach properties of the resonator element 2.

Here, if High performance FIG. 1 is equal to or greater than 0.8, the resonator element 2 may be sufficiently obtained which has a reduced size and improved vibrating characteristics together. For this, the length H of the hammer head 59 is set in order to satisfy a relationship of 0.183≤H/L≤0.597 in the resonator element 2. That is, the resonator element 2 is configured so as to satisfy the expression (1). It is preferable that a relationship of 0.238≤H/L≤0.531 also be satisfied at this range such that High performance FIG. 1 is equal to or greater than 0.9. Accordingly, the resonator element 2 is obtained which has both a further reduced size and further improved vibrating characteristics.

It is preferable that a relationship of 0.012<H/L<0.3 in the hammer heads 59 and 69 be satisfied when the entire length of the vibrating arm 5 (length in the Y' axial direction) is set to L, and the length of the hammer head 59 (length in the Y' axial direction) is set to H, and more preferable that the hammer heads 59 and 69 be satisfied by a relationship of 0.046<H/L<0.223, in the resonator element 2, similarly to the above description. The CI value of the resonator element 2 is suppressed and lowered by satisfaction of the relationship, and thus the resonator element 2 is obtained which has reduced vibration loss and excellent vibrating characteristics.

Since the hammerheads 59 and 69 have the same shape, the hammer head 59 will be representatively described below.

In this embodiment, "base end of the vibrating arm 5" is set to a location of the line segment, which is positioned in the center of the width of the vibrating arm 5 (length in the X axial direction), and the line segment links a location at which the side surface 514 is connected to the base 4, and a location at which the side surface 513 is connected to the base 4.

In the vibrating arm 5, a relationship of 1.5≤W2/W1≤10.0 is satisfied by when the width of the arm 51 (length in the X axial direction) is set to W1, and the width of the hammer head 59 (length in the X axial direction) is set to W2. If the relationship is satisfied, the relationship is not particularly limited, but it is preferable that a relationship of 1.6≤W2/W1≤7.0 be satisfied. The relationship is satisfied, and thus it is possible to reliably widen the width of the hammer head 59, minimization and high performance are achieved, and it is possible to decrease an increase of the vibration leakage resulting from the excessively wide width of the hammer head 59, and an increase of a wrench of the vibrating arm 5 occurring during flexural vibration. Thus, even though the length H of the hammer head 59 is relatively short as described above (even though it is less than 30% of L), it is possible to sufficiently show mass effect by the hammer head 59. Accordingly, the entire length L of the vibrating arm 5 is controlled by satisfaction of a relationship of 1.5≤W2/W1≤10.0, and thus it is possible to minimize the resonator element 2.

In this manner, a relationship of 1.2%<H/L<30.0%, and the relationship of 1.5≤W2/W1≤10.0 are satisfied in the vibrating arm 5, and a synergy effect of the two relationships occurs, and thus the resonator element 2 is obtained which is minimized and in which the CI value is sufficiently controlled.

It is possible to obtain the minimized resonator element used in an oscillator mounted in a portable sound device, an IC card, and the like, due to L≤2 μm, preferably, L≤1 μm. It is possible to obtain a resonator element which performs resonance at a low frequency, and is used in an oscillation circuit realizing low power consumption even at the range of L, due to W1≤100 μm, preferably, W1≤50 μm. If being an adiabatic-like region, it is preferable that a relationship of W1≤12.8 μm be satisfied when the vibrating arm extends in the Y' direction in the Z quartz crystal plate, and the flexural vibration is performed in the X direction, that a relationship of W1≤14.4 μm be satisfied when the vibrating arm extends in the X direction in the Z quartz crystal plate, and the flexural vibration is performed in the Y' direction, and that a relationship of W1≤15.9 μm be satisfied when the vibrating arm extends in the Y' direction in the X quartz crystal plate, and the flexural vibration is performed in the Z' direction. It is possible to reliably be the adiabatic-like region by making the resonator element in this manner. By forming the groove, the thermoelastic loss is reduced, the Q value is increased, and the CI value is decreased (high electric field efficiency, wide driving area) by driving at a region where the groove is formed.

It will be verified based on a simulation result that the relationship of 1.2%<H/L<30.0%, and the relationship of 1.5≤W2/W1≤10.0 are satisfied, and thus it is possible to show the above-mentioned effect. The simulation is performed using one vibrating arm 5. The vibrating arm 5 used in this simulation is configured with a Z quartz crystal (rotation angle of 0°). The size of the vibrating arm 5 has the entire length L of 1210 μm, and the thickness T of 100 μm, the width W1 of the arm 51 being 98 μm, the width W2 of the hammer head 59 being 172 μm, the depth T1 and T2 of the grooves 52 and 53 together being 45 μm, and the width W3 of the bank portions 511a and 512a respectively being 6.5 μm, as illustrated in FIG. 6. In the vibrating arm 5, simulation is performed with changing of the length H of the hammer head 59.

It is confirmed by the inventors that a result having tendency similar to that of a simulation result illustrated in the followings is obtained even by changing the size (L, W1, W2, T, T1, T2, and W3) of the vibrating arm 5.

The following Table 1 is a table illustrating change of the CI value as the length H of the hammer head 59 is changed. The CI value at each sample is calculated in this simulation, as will be described later. The Q value is obtained taking only the thermoelastic loss into consideration by using a finite elements method. The Q value has a frequency dependence property, and thus the obtained Q value is converted into the Q value at 32.768 kHz (the Q value subsequent to F conversion). R1 (CI value) is calculated based on the Q value subsequent to F conversion. The CI value has also frequency dependence property, and thus the obtained R1 is converted into R1 at 32.768 kHz, and the inverse of the converted R1 is set to "low R1 figure". The low R1 figure is figures when the inverse of the largest R1 in all the simulation is set to 1.

Accordingly, it is meant that the CI value decreases as the low R1 figure approaches 1. FIG. 8A illustrates a graph plotted with a horizontal axis indicating an occupancy factor of the hammer head (H/L), and a vertical axis indicating the low R1 figure, and FIG. 8B illustrates a graph of an enlarged part in FIG. 8A.

A method of converting the Q value into the Q value subsequent to F conversion will be described later.

Calculation is performed as follows using the following Expression II and Expression III.

$$f0=\pi k/(2\rho Cpa^2) \quad \text{(Expression II)}$$

$$Q=\{\rho Cp/(C\alpha 2H)\}\times[\{1+(f/f0)^2\}/(f/f0)] \quad \text{(Expression III)}$$

Here, in (Expression II) and (Expression III), π means the circular constant, k means thermal conductivity of the vibrating arm 5 in the width direction, ρ means mass density, Cp means thermal capacity, C means elastic stiffness constant in expansion and contraction in the longitudinal direction of the vibrating arm 5, α means thermal expansion rate in the longitudinal direction of the vibrating arm 5, H means absolute temperature, and f means natural frequency. a means a width of the vibrating arm 5 when the vibrating arm 5 is considered as a plate shape as illustrated in FIG. 6 (effective width). In FIG. 6, the grooves 52 and 53 are not formed in the vibrating arm 5, but it is possible to also perform conversion into the Q value subsequent to F conversion using a value of a at this time.

Natural frequency of the vibrating arm 5 is set to F1 by using simulation, the obtained Q value is set to Q1, and the value of a is obtained by using (Expression II) and (Expression III) and applying f=F1 and Q=Q1. Using the obtained value of a, 32.768 kHz is applied as f, and thus the Q value is calculated from an expression (4) which will be described later. The Q value obtained in this manner is the Q value subsequent to F conversion.

TABLE 1

|  | H/L | Natural frequency f1[Hz] | Q1 | Q value subsequent to F conversion | R1 | 1/R1 | Low R1 figure |
|---|---|---|---|---|---|---|---|
| SIM001 | 0.6% | 7.38E+04 | 159,398 | 76,483 | 3.50E+03 | 1.270E−04 | 0.861 |
| SIM002 | 3.3% | 5.79E+04 | 135,317 | 76,606 | 4.15E+03 | 1.363E−04 | 0.923 |
| SIM003 | 6.0% | 4.99E+04 | 120,906 | 79,442 | 4.58E+03 | 1.435E−04 | 0.972 |
| SIM004 | 8.6% | 4.48E+04 | 111,046 | 81,157 | 4.98E+03 | 1.467E−04 | 0.994 |
| SIM005 | 11.2% | 4.13E+04 | 103,743 | 82,223 | 5.37E+03 | 1.476E−04 | 1.000 |
| SIM006 | 13.9% | 3.88E+04 | 98,038 | 82,843 | 5.74E+03 | 1.471E−04 | 0.997 |

TABLE 1-continued

| | H/L | Natural frequency f1[Hz] | Q1 | Q value subsequent to F conversion | R1 | 1/R1 | Low R1 figure |
|---|---|---|---|---|---|---|---|
| SIM007 | 16.5% | 3.68E+04 | 93,507 | 83,225 | 6.10E+03 | 1.458E-04 | 0.988 |
| SIM008 | 19.8% | 3.49E+04 | 88,856 | 83,328 | 6.56E+03 | 1.430E-04 | 0.969 |
| SIM009 | 23.1% | 3.35E+04 | 85,017 | 83,115 | 7.02E+03 | 1.393E-04 | 0.944 |
| SIM010 | 26.4% | 3.24E+04 | 81,772 | 82,657 | 7.50E+03 | 1.348E-04 | 0.914 |
| SIM011 | 29.8% | 3.16E+04 | 78,811 | 81,824 | 8.01E+03 | 1.296E-04 | 0.878 |
| SIM012 | 33.1% | 3.09E+04 | 76,247 | 80,864 | 8.56E+03 | 1.239E-04 | 0.839 |
| SIM013 | 36.4% | 3.04E+04 | 73,813 | 79,591 | 9.17E+03 | 1.176E-04 | 0.796 |
| SIM014 | 39.7% | 3.00E+04 | 71,409 | 77,963 | 9.87E+03 | 1.106E-04 | 0.749 |
| SIM015 | 43.0% | 2.98E+04 | 69,077 | 76,078 | 1.07E+04 | 1.032E-04 | 0.699 |
| SIM016 | 46.3% | 2.96E+04 | 66,818 | 73,978 | 1.16E+04 | 9.557E-05 | 0.648 |
| SIM017 | 49.6% | 2.95E+04 | 64,449 | 71,494 | 1.27E+04 | 8.750E-05 | 0.593 |
| SIM018 | 52.9% | 2.96E+04 | 62,042 | 68,733 | 1.40E+04 | 7.928E-05 | 0.537 |
| SIM019 | 56.2% | 2.97E+04 | 59,670 | 65,800 | 1.55E+04 | 7.104E-05 | 0.481 |
| SIM020 | 59.5% | 3.00E+04 | 57,018 | 62,370 | 1.75E+04 | 6.257E-05 | 0.424 |
| SIM021 | 62.8% | 3.03E+04 | 54,502 | 58,918 | 1.98E+04 | 5.447E-05 | 0.369 |
| SIM022 | 66.1% | 3.08E+04 | 51,676 | 54,983 | 2.29E+04 | 4.640E-05 | 0.314 |
| SIM023 | 69.4% | 3.14E+04 | 48,788 | 50,857 | 2.69E+04 | 3.871E-05 | 0.262 |
| SIM024 | 72.7% | 3.23E+04 | 45,699 | 46,416 | 3.23E+04 | 3.140E-05 | 0.213 |
| SIM025 | 76.0% | 3.33E+04 | 42,398 | 41,687 | 4.00E+04 | 2.461E-05 | 0.167 |
| SIM026 | 79.3% | 3.47E+04 | 39,084 | 36,902 | 5.08E+04 | 1.857E-05 | 0.126 |
| SIM027 | 82.6% | 3.65E+04 | 35,523 | 31,872 | 6.77E+04 | 1.325E-05 | 0.090 |
| SIM028 | 85.5% | 3.86E+04 | 32,226 | 27,387 | 9.12E+04 | 9.314E-06 | 0.063 |
| SIM029 | 88.3% | 4.13E+04 | 28,763 | 22,842 | 1.31E+05 | 6.056E-06 | 0.041 |
| SIM030 | 91.1% | 4.50E+04 | 24,918 | 18,132 | 2.11E+05 | 3.448E-06 | 0.023 |
| SIM031 | 93.9% | 5.07E+04 | 21,042 | 13,614 | 4.04E+05 | 1.602E-06 | 0.011 |

The resonator element 2 is obtained by the inventors in which the low R1 figure is equal to or more than 0.87. The low R1 figure is equal to or more than 0.87 of the objective in SIM002 to SIM011 in which a relationship of 1.2%<H/L<30.0% is satisfied, as understood from Table 1 and the graph in FIG. 8. Particularly, it is understood that the low R1 figure exceeds 0.95, and the CI value is further lowered in SIM003 to SIM008 in which a relationship of 4.6%<H/L<22.3% is satisfied. From the above-described simulation result, it is verified that the resonator element 2 is obtained in which the CI value is sufficiently controlled, by satisfaction of the relationship of 1.2%<H/L<30.0%.

As illustrated in FIG. 3, a pair of the first driving electrodes 84 and a pair of the second driving electrodes 85 are formed in the vibrating arm 5. One of the first driving electrodes 84 is formed on a side surface of the groove 52, and the other of the first driving electrodes 84 is formed on a side surface of the groove 53. One of the second driving electrodes 85 is formed on the side surface 513, and the other of the second driving electrodes 85 is formed on the side surface 514.

Similarly, a pair of the first driving electrodes 84 and a pair of the second driving electrodes 85 are formed in the vibrating arm 6. One of the first driving electrodes 84 is formed on the side surface 613, and the other of the first driving electrodes 84 is formed on the side surface 614. One of the second driving electrodes 85 is formed on a side surface of the groove 62, and the other of the second driving electrodes 85 is formed on a side surface of the groove 66.

Each of the first driving electrodes 84 is pulled out of the holding arm 74 by a wiring (not illustrated), and is electrically connected to the connection terminal 951 through the conductive adhesive 11. Similarly, each of the second driving electrodes 85 is pulled out of the holding arm 75 by a wiring (not illustrated), and is electrically connected to the connection terminal 961 through the conductive adhesive 12.

The vibrating arms 5 and 6 vibrate at a predetermined frequency in the X axial direction (direction to the inside of the surface) in order to repeat the proximity and separation of the vibrating arms 5 and 6 when the alternating voltage is applied between the first and second driving electrodes 84 and 85. This vibration mode is generally called "X reverse phase mode", and this vibration mode is also referred to "fundamental vibration mode" in the following description.

A component material of the first and second driving electrodes 84 and 85 is not particularly limited as long as having conductivity and adhesive property, for example, indium tin oxide (ITO), a metal material such as gold (Au), gold alloy, platinum (Pt), aluminum (Al), aluminum alloy, silver (Ag), silver alloy, chrome (Cr), chrome alloy, nickel (Ni), nickel alloy, copper (Cu), molybdenum (Mo), niobium (Nb), tungsten (W), iron (Fe), titanium (Ti), cobalt (Co), zinc (Zn), and zirconium (Zr) are included.

It is possible to be a configuration in which a Au layer having a thickness of 700 Å or less is formed on a Cr layer having a thickness of 700 Å or less as a specific configuration of the first and second driving electrodes 84 and 85. Particularly, since Cr or Au has large thermoelastic loss, the Cr layer and the Au layer preferably have a thickness of 200 Å or less. When having high dielectric breakdown resistance, the Cr layer and the Au layer preferably have a thickness of 1000 Å or more. Since Ni is a substance having thermal expansion coefficient close to that of quartz crystal, it is possible to reduce thermal stress due to the electrodes and to obtain the resonator element having good long term reliability by using a Ni layer as the ground instead of the Cr layer.

The configuration of the resonator element 2 is described above. As described above, the grooves 52, 53, 62, and 63 are respectively formed in the vibrating arms 5 and 6 of the resonator element 2, and thus it is possible to reduce the thermoelastic loss, and to show excellent vibrating characteristics. In this regard, an example of the vibrating arm 5 will be specifically described below.

The vibrating arm 5 performs the flexural vibration in the direction to the inside of the surface by applying the alternating voltage to the first and second driving electrodes 84 and 85, as described above. If the side surface 513 of the arm 51 contracts, the side surface 514 extends; on the contrary, if the side surface 513 of the arm 51 extends, the side surface 514 contracts during the flexural vibration, as illustrated in FIG. 9. When the Gough-Joule effect does not occur in the vibrating arm 5 (energy elasticity is predominant with respect to entropy elasticity), among the side surfaces 513 and 514, the temperature increases at the contracting surface side, and the temperature decreases at the extending surface side. Accordingly, temperature difference occurs between the side surface 513 and the side surface 514, that is, inside the arm 51. Loss of the vibration energy occurs due to the thermal conductivity occurring from the temperature difference, and this results in reducing the Q value of the resonator element 2. The energy loss dependent on reducing the Q value is also referred to as the thermoelastic loss.

In a resonator element vibrating in the flexural vibration which is performed in the configuration similar to that of the resonator element 2, when a flexural vibration frequency f (mechanical flexural vibration) of the vibrating arm 5 is changed, the Q value when the flexural vibration frequency of the vibrating arm 5 matches a thermal relaxation frequency fm is the minimum. The thermal relaxation frequency fm may be obtained by using the following expression (2). However, in the expression (2), if π means the circular constant and e means the Napier's number, τ means a relaxation time necessary for the temperature difference being $e^{-1}$ times by the thermal conductivity.

$$fm = \frac{1}{2\pi\tau} \quad (2)$$

If the thermal relaxation frequency is set to fm0 in a plate structure (structure in which cross-sectional shape is rectangular), fm0 can be obtained by the following expression (3). In the expression (3), π means the circular constant, k means thermal conductivity of the vibrating arm 5 in the vibration direction, ρ means mass density of the vibrating arm 5, Cp means thermal capacity of the vibrating arm 5, and a means a width of the vibrating arm 5 in the vibration direction. When a constant with respect to a material of the vibrating arm 5 (that is, quartz crystal) is input in the thermal conductivity k, the mass density ρ, the thermal capacity Cp of the expression (3), and the obtained thermal relaxation frequency fm0 are set to a value when the grooves 52 and 53 are not provided in the vibrating arm 5.

$$fm0 = \frac{\pi k}{2\rho C p a^2} \quad (3)$$

In the vibrating arm 5, the grooves 52 and 53 are formed to be positioned between the side surfaces 513 and 514. Accordingly, the heat transfer path is formed to detour to the grooves 52 and 53 for thermal-averaging the temperature difference occurring at the side surfaces 513 and 514 during the flexural vibration of the vibrating arm 5, and the heat transfer path is longer than a straight-line distance (the shortest distance) between the side surfaces 513 and 514. Accordingly, the relaxation time τ becomes long, and the thermal relaxation frequency fm becomes low compared to when the grooves 52 and 53 are not provided in the vibrating arm 5.

FIG. 10 is a graph representing f/fm dependence of the Q value of the resonator element in the flexural vibration mode. In FIG. 10, a curved line F1 indicated by a dot line indicates when a groove is formed in a vibrating arm as in the resonator element 2, and a curved line F2 indicated by a solid line indicates when a groove is not formed in a vibrating arm. As illustrated in FIG. 10, shapes of the curved lines F1 and F2 do not change, but the curved line F1 shifts to a direction of frequency reduction with respect to the curved line F2 depending on reducing the above-mentioned thermal relaxation frequency fm. Accordingly, if the thermal relaxation frequency when a groove is formed in a vibrating arm as in the resonator element 2 is set to fm1, the Q value of a resonator element in which a groove is formed is always higher than the Q value of a resonator element in which a groove is not formed by satisfaction of the following expression (4).

$$f < \sqrt{fm0 fm1} \quad (4)$$

It is possible to obtain the higher Q value if a relationship of the following expression (5) is limited.

$$\frac{f}{fm0} > 1 \quad (5)$$

In FIG. 10, a region where a relationship of f/fm<1 is satisfied is also referred to an isothermal-like region, and the Q value increases as f/fm decreases, in the isothermal-like region. This is because as a mechanical frequency of the vibrating arm is lowered (the vibration of the vibrating arm slows down), the temperature difference is unlikely to occur in the vibrating arm as described above. Accordingly, the thermoelastic loss infinitely approaches 0 (zero) by a static operation in accordance with an isothermal process in a limit when f/fm infinitely approaches 0 (zero). On the other hand, a region where a relationship of f/fm>1 is satisfied is also referred to as an adiabatic-like region, and the Q value increases as f/fm increases in the adiabatic-like region. This is because as the mechanical frequency of the vibrating arm increases, switching increase and decrease of the temperature on each side surface is performed at a high speed, and a time the thermal conductivity takes to occur as described above is not present. Accordingly, the thermoelastic loss infinitely approaches 0 (zero) by an adiabatic operation in a limit when f/fm infinitely increases. From this, the satisfaction of f/fm>1 may mean that f/fm is in the adiabatic-like region, in other words.

Here, a component material of the first and second driving electrodes 84 and 85 (metal material) has high thermal conductivity compared to quartz crystal that is a component material of the vibrating arms 5 and 6. Accordingly, the thermal conductivity is actively performed through the first driving electrode 84 in the vibrating arm 5, and the thermal conductivity is actively performed through the second driving electrode 85 in the vibrating arm 6. When the thermal conductivity is actively performed through the first and second driving electrodes 84 and 85, the relaxation time τ becomes short. It is preferable that the first driving electrode 84 be divided into a side surface 513 side and a side surface 514 side on the bottom surfaces of the grooves 52 and 53 in the vibrating arm 5, the second driving electrode 85 be divided into a side surface 613 side and a side surface 614 side on the bottom surfaces of the grooves 62 and 63 in the vibrating arm 6, and thus the thermal conductivity as described above be reduced. As a result, in the adiabatic-like region, reduction of the relaxation time τ is prevented, and the resonator element 2 is obtained which has the further high Q value.

The thermoelastic loss is described above.

The expression (5) is satisfied in the resonator element 2, and it is preferable that the resonator element 2 be configured such that the grooves 52, 53, 62, and 63 having a predetermined shape are formed in the vibrating arms 5 and 6, and thus the Q value higher than that in the resonator element in the related art is obtained. Configurations of the grooves 52, 53, 62, and 63 formed in the vibrating arms 5 and 6 will be specifically described below. Since the vibrating arms 5 and 6 have the same configuration as each other, the grooves 52 and 53 formed in the vibrating arm 5 will be representatively described below, and descriptions of the grooves 62 and 63 will be omitted which are formed in the vibrating arm 6.

As illustrated in FIG. 3, it is preferable that the following expressions (6) and (7) are satisfied together in the resonator element 2 when the thickness of the vibrating arm 5 (length in the Z' axial direction) is set to T, the maximum depth of the respective grooves 52 and 53 is set to t, and the width of the bank portions 511a, 511b, 512a, and 512b which are positioned on both sides of the main surfaces 511 and 512 in the X axial direction of the grooves 52 and 53 (the main surface with the groove 52 interposed therebetween along the width direction vertical to the longitudinal direction of the vibrating arm 5) is set to W3 [μm].

$$0.375 \leq \frac{t}{T} \leq 0.483 \qquad (6)$$

$$-8.835 \times 10^1 \times \left(\frac{t}{T}\right)^2 + 8.737 \times 10^1 \times \left(\frac{t}{T}\right) - 1.872 \times 10^1 \leq \qquad (7)$$
$$W3 \leq 1.136 \times 10^2 \times \left(\frac{t}{T}\right)^2 - 1.385 \times 10^2 \times \left(\frac{t}{T}\right) + 5.205 \times 10^1$$

A region where the following expressions (6) and (7) are satisfied together is present in at least a part of the arm 51, and thus it is possible to obtain the resonator element 2 having more excellent vibrating characteristics than those in the related art. The region where the following expressions (6) and (7) are satisfied together may be present in at least a part of the arm 51 in the longitudinal direction, but it is preferable that a base portion of the arm 51 be included the region. The base portion is a part of the arm 51 where great flexural deformation occurs, and is a portion where it is likely to influence the vibrating characteristics in the entirety of the vibrating arm 5. Accordingly, the region is present at least in the base portion, and thus it is possible to further reliably and effectively obtain the resonator element 2 having more excellent vibrating characteristics than that in the related art. In other words, the region is present at least in a portion where an amount of flexural deformation of the vibrating arm 5 is greatest, and thus it is possible to further reliably and effectively obtain the resonator element 2 having more excellent vibrating characteristics than that of a product in the related art.

The resonator element 2 is configured in such a manner that the arm 51 has almost the same width and thickness in most areas other than both end portions thereof, and the grooves 52 and 53 have almost the same width and depth in the most area other than both end portions thereof. Thus, the region in the resonator element 2 may extend in the longitudinal direction of the arm 51. Accordingly, it is possible to further significantly show the above-mentioned effect in the resonator element 2. Specifically, it is preferable that the region be present at a ⅓ portion of the entire length of the vibrating arm 5 including the base portion (length in the Y' axial direction). In this manner, it is possible to further reliably and effectively obtain the resonator element 2 having more excellent vibrating characteristics than that of a product in the related art.

This will be verified below based on a result of a simulation performed by the inventors. In the followings, the Z cut quartz crystal plate is patterned, the simulation is representatively used which uses the resonator element having the flexural vibration frequency (mechanical flexural vibration frequency) f=32.768 kHz, but it is verified by the inventors that the simulation result is rarely different from a simulation result which will be described below at a range of the flexural vibration frequency f being 32.768 kHz±1 kHz.

In this simulation, a quartz crystal resonator blank is used which is obtained by patterning a quartz crystal substrate using the wet-etching. Accordingly, the grooves 52 and 53 have a shape in which a crystal face of the quartz crystal is shown, as illustrated in FIG. 11. Specifically, since an etching rate in the −X axial direction is lower than an etching rate in the +X axial direction, the side surface in the −X axial direction is comparatively gradually inclined, and the side surface in the +X axial direction is inclined close to verticality. FIG. 11 illustrates the same cross-section as in FIG. 3.

The size of the vibrating arm 5 used in this simulation has the length of 1000 μm, the thickness of 120 μm, and the width of 80 μm. It is confirmed by the inventors that the result has a tendency similar to that of a simulation result illustrated in the followings, which is obtained by changing the length, the thickness, and the width. In this simulation, the vibrating arm 5 is used in which the first and second driving electrodes 84 and 85 are not formed.

FIG. 12 is a graph illustrating a relationship of the Q value and the width W3 of the bank portions 511a, 511b, 512a, and 512b when t/T is respectively set to 0.208, 0.292, 0.375, 0.458, and 0.483. The Q value has frequency dependence property, and thus the obtained Q value under each condition in the simulation of t/T is converted into the Q value at 32.768 kHz (the Q value subsequent to F conversion), and the inverse of the converted Q value is set to "High performance FIG. 2". High performance FIG. 2 is figures when the largest value thereof is set to 1 under each condition of t/T. Accordingly, it is meant that the Q value increases as High performance FIG. 2 approaches 1.

A method of converting the Q value into the Q value subsequent to F conversion will be described later.

Calculation is performed as follows using the following expressions (8) and (9). Here, in the expressions (8) and (9), π c means the circular constant, k means thermal conductivity of the vibrating arm 5 in the width direction, ρ means mass density, Cp means thermal capacity, C means elastic stiffness constant in expansion and contraction in the longitudinal direction of the vibrating arm 5, α means thermal expansion rate in the longitudinal direction of the vibrating arm 5, H means absolute temperature, and f means natural frequency. a means a width of the vibrating arm 5 when the vibrating arm 5 is considered as a plate shape as illustrated in FIG. 13 (effective width). In FIG. 13, the grooves 52 and 53 are not formed in the vibrating arm 5, but it is possible to also perform conversion into the Q value subsequent to F conversion using a value of a at this time.

$$f_0 = \frac{\pi k}{2\rho C p a^2} \qquad (8)$$

$$Q = \frac{\rho C p}{C \alpha^2 H} \times \frac{1 + \left(\frac{f}{f_0}\right)^2}{\frac{f}{f_0}} \qquad (9)$$

Natural frequency of the vibrating arm 5 is set to F1 by using simulation, the obtained Q value is set to Q1, and the value of a is obtained by using the expressions (8) and (9) and applying f=F1 and Q=Q1. Using the obtained value of a, 32.768 kHz is applied as f, and thus the Q value is calculated from the expression (9). The Q value obtained in this manner is the Q value subsequent to F conversion.

Here, if High performance FIG. 2 is equal to or more than 0.8, the resonator element 2 is sufficiently obtained which has a high Q value (having excellent vibrating characteristics), and if High performance FIG. 2 is equal to or more than 0.9, the resonator element 2 is obtained which has a further high Q value. FIG. 14 illustrates a plotted graph of a point A1, a point A2, a point B1, a point B2, a point C1, and a point C2, the point A1 and the point A2 in which the high performance figure is satisfied with 0.8 when t/T=0.375, the point B1 and the point B2 in which the high performance figure is satisfied with 0.8 when t/T=0.458, and the point C1 and the point C2 in which the high performance figure is satisfied with 0.8 when t/T=0.48. A quadratic equation (approximate expression) linking the points A1, B1, and C1 in which the width W3 under each condition is small is illustrated with the following expression (10), a quadratic equation (approximate expression) linking the points A2, B2, and C2 in which the width W3 under each condition is relatively large is illustrated with the following expression (11), and the unit is [µm].

$$-8.835 \times 10^1 \times \left(\frac{t}{T}\right)^2 + 8.737 \times 10^1 \times \left(\frac{t}{T}\right) - 1.872 \times 10^1 \qquad (10)$$

$$1.136 \times 10^2 \times \left(\frac{t}{T}\right)^2 - 1.385 \times 10^2 \times \left(\frac{t}{T}\right) + 5.205 \times 10^1 \qquad (11)$$

Accordingly, if the width W3 is used with the expression (10) used as an upper limit and the expression (11) used as a lower limit, that is, if the expressions (6) and (7) are satisfied, it is possible to obtain the resonator element 2 having excellent vibrating characteristics.

FIG. 15 illustrates a plotted graph of a point A3, a point A4, a point B3, a point B4, a point C3, and a point C4, the point A3 and the point A4 in which the high performance figure is satisfied with 0.9 when t/T=0.292, the point B3 and the point B4 in which the high performance figure is satisfied with 0.9 when t/T=0.375, and the point C3 and the point C4 in which the high performance figure is satisfied with 0.9 when t/T=0.48. A quadratic equation (approximate expression) linking the points A3, B3, and C3 in which the width W3 under each condition is small is illustrated with the following expression (12), a quadratic equation (approximate expression) linking the points A4, B4, and C4 in which the width W3 under each condition is relatively large is illustrated with the following expression (13), and the unit is [µm].

$$6.155 \times \left(\frac{t}{T}\right)^2 + 2.099 \times \left(\frac{t}{T}\right) + 1.617 \qquad (12)$$

$$-3.773 \times 10^1 \times \left(\frac{t}{T}\right)^2 + 8.272 \times \left(\frac{t}{T}\right) + 1.474 \times 10^1 \qquad (13)$$

Accordingly, the following expressions (14) and (15) are satisfied together, and thus it is possible to obtain the resonator element 2 having further excellent vibrating characteristics. The unit is [µm].

$$0.292 \leq \frac{t}{T} \leq 0.483 \qquad (14)$$

$$6.155 \times \left(\frac{t}{T}\right)^2 + 2.099 \times \left(\frac{t}{T}\right) + 1.617 \leq W \leq \qquad (15)$$
$$-3.773 \times 10^1 \times \left(\frac{t}{T}\right)^2 + 8.272 \times \left(\frac{t}{T}\right) + 1.474 \times 10^1$$

FIG. 16 illustrates a plotted graph of a point A5, a point B5, a point C5, the point A5 in which the high performance figure is satisfied with 1 when t/T=0.292, the point B5 in which the high performance figure is satisfied with 1 when t/T=0.375, and the point C5 in which the high performance figure is satisfied with 1 when t/T=0.48. A quadratic equation (approximate expression) linking the points A5, B5, and C5 is illustrated with the following expression (16). The unit is [µm].

$$-3.448 \times 10^1 \times \left(\frac{t}{T}\right)^2 + 2.237 \times 10^1 \times \left(\frac{t}{T}\right) + 4.079 \qquad (16)$$

Accordingly, the following expressions (17) and (18) are satisfied together, and thus it is possible to obtain the resonator element 2 having further excellent vibrating characteristics.

$$0.292 \leq \frac{t}{T} \leq 0.483 \qquad (17)$$

$$W = -3.448 \times 10^1 \times \left(\frac{t}{T}\right)^2 + 2.237 \times 10^1 \times \left(\frac{t}{T}\right) + 4.079 \qquad (18)$$

In the resonator element 2, a range of f/fm>1 when fm=πk/(2ρCpa²) is satisfied, and it is preferable that the resonator element 2 be configured such that the grooves 52, 53, 62, and 63 having a predetermined shape are formed in the vibrating arms 5 and 6, and thus the Q value is obtained higher than that in the resonator element in the related art.

Configurations of the grooves 52, 53, 62, and 63 formed in the vibrating arms 5 and 6 will be specifically described below. Since the vibrating arms 5 and 6 have the same configuration as each other, the grooves 52 and 53 formed in the vibrating arm 5 will be representatively described below, and descriptions of the grooves 62 and 63 will be omitted which are formed in the vibrating arm 6.

As illustrated in FIG. 3, the following expression (A) is satisfied together in the resonator element 2 when the widths of the bank portions 511a and 511b (length in the X axial direction) are almost equal and are set to W3 [µm] which are positioned on both sides of the main surface 511 in the X axial direction of the groove 52 (the main surface with the groove 52 interposed therebetween along the width direction vertical to the longitudinal direction of the vibrating arm 5), the thickness (length in the Z' axial direction) of the vibrating arm 5 is set to T, the summation of the maximum depth t of the respective grooves 52 and 53 is set to ta, and ta/T is set to η.

$$4.236 \times 10 \times \eta^2 - 8.473 \times 10 \times \eta + 4.414 \times 10 \leq W3 \leq -3.367 \times 10 \times \eta^2 + 7.112 \times 10 \times \eta - 2.352 \times 10 \qquad (A)$$

wherein 0.75≤η≤1.00

The similar relationship is also satisfied with respect to the width of the bank portions (portion) 512a and 512b which are positioned on both sides of the main surface 512 in the X axial direction of the groove 53.

A region Sa where the expression (A) is satisfied is present in at least a part of the vibrating arm 5, and thus it is possible to obtain the resonator element 2 having more excellent vibrating characteristics than that in the related art. The region Sa where the expression (A) is satisfied may be present in at least a part of the vibrating arm 5 in the longitudinal direction, but it is preferable that a base portion of the vibrating arm 5 be included the region. The base portion is a part of the vibrating arm 5 where the flexural deformation occurs largely, and is a portion where it is likely that vibrating characteristics in the entirety of the vibrating arm 5 are influenced. Accordingly, the region Sa is present at least in the base portion, and thus it is possible to further reliably and effectively obtain the resonator element 2 having more excellent vibrating characteristics than that in the related art. In other words, the region Sa is present at least in a portion where an amount of the flexural deformation in the vibrating arm 5 is greatest, and thus it is possible to further reliably and effectively obtain the resonator element 2 having more excellent vibrating characteristics than that of a product in the related art. More specifically, it is preferable that the region Sa be directed to the base portion of the arm 51 and include a region of 33% length with respect to the length of the arm 51 and be present.

The resonator element 2 in this embodiment is configured in such a manner that the arm 51 has almost the same width and thickness in the most area (area S1) other than both end portions thereof, and the grooves 52 and 53 have almost the same width and depth in the entire area (area S2), as illustrated in FIG. 1. The region Sa is configured with a region where these areas S1 and S2 are overlapped in the resonator element 2, and thus the region Sa may extend in the longitudinal direction of the vibrating arm 5. Accordingly, the above-mentioned effect is significantly shown.

The Q value obtained by taking only the thermoelastic loss into consideration is set to $Q_{TED}$ in the expression (A), and it is set as a condition that $Q_{TED}$ is larger than a predetermined value.

Description is continued below, but $Q_{TED}$ is standardized, and then description thereof will be performed. Standardization of $Q_{TED}$ is performed as expected $Q_{TED}$ when η infinitely approaches 1 is set to 1. That is, when expected $Q_{TED}$ when η infinitely approaches 1 is set to $Q_{TED}$ (η=1) and $Q_{TED}$ before standardization is set to $Q_{TED}b$, standardized $Q_{TED}$ is set to $Q_{TED}a$, and $Q_{TED}a$ represented by $Q_{TED}b/Q_{TED}$ (η=1).

The expression (A) includes a condition of $Q_{TED}a \geq 0.65$. Respective conditions of $Q_{TED}a \geq 0.70$, $Q_{TED}a \geq 0.75$, $Q_{TED}a \geq 0.80$, and $Q_{TED}a \geq 0.85$ will be described later.

$Q_{TED}a \geq 0.70$

The condition of $Q_{TED}a \geq 0.70$ satisfies a relationship illustrated in the following expression (B).

$$5.459 \times 10 \times \eta^2 - 1.110 \times 10^2 \times \eta + 5.859 \times 10 \leq W3 \leq -4.500 \times 10 \times \eta^2 + 9.490 \times 10 \times \eta - 3.698 \times 10 \,[\mu m] \quad (B)$$

wherein $0.80 \leq \eta < 1.00$ $Q_{TED}a \geq 0.75$

The condition of $Q_{TED}a \geq 0.75$ satisfies a relationship illustrated in the following expression (C).

$$6.675 \times 10 \times \eta^2 - 1.380 \times 10^2 \times \eta + 7.392 \times 10 \leq W3 \leq -5.805 \times 10 \times \eta^2 + 1.228 \times 10^2 \times \eta - 5.267 \times 10 \,[\mu m] \quad (C)$$

wherein $0.85 \leq \eta < 1.00$ $Q_{TED}a \geq 0.80$

The condition of $Q_{TED}a \geq 0.80$ satisfies a relationship illustrated in the following expression (D).

$$7.752 \times 10 \times \eta^2 - 1.634 \times 10^2 \times \eta + 8.903 \times 10 \leq W3 \leq -6.993 \times 10 \times \eta^2 + 1.496 \times 10^2 \times \eta - 6.844 \times 10 \,[\mu m] \quad (D)$$

wherein $0.90 \leq \eta < 1.00$ $Q_{TED}a \geq 0.85$

The condition of $Q_{TED}a \geq 0.85$ satisfies a relationship illustrated in the following expression (E).

$$-1.847 \times 10 \times \eta + 2.217 \times 10 \leq W3 \leq 1.189 \times 10 \times \eta - 8.433 \,[\mu m] \quad (E)$$

wherein $0.95 \leq \eta < 1.00$ $Q_{TED}a \geq 0.90$

The condition of $Q_{TED}a \geq 0.90$ satisfies a relationship illustrated in the following expression (F).

$$-3.300 \times 10 \times \eta + 3.730 \times 10 \,[\mu m] \leq W \,[\mu m] \leq 3.302 \times 10 \times \eta - 2.333 \times 10 \,[\mu m] \quad (F)$$

wherein, $0.95 \leq \eta < 1.00$

These conditions are verified base on a result analyzed by simulation performed by the inventors. In the followings, the Z cut quartz crystal plate is patterned, the simulation is representatively used which uses the resonator element 2 having the flexural vibration frequency (mechanical flexural vibration frequency) f=32.768 kHz, but it is confirmed by the inventors that the analysis result is rarely different from a simulation result obtained by performing the simulation which will be described below at a range of the flexural vibration frequency f being 32.768 kHz±1 kHz.

In this simulation, the resonator element 2 including the quartz crystal resonator blank 3 is used and the quartz crystal resonator blank 3 is obtained by patterning a quartz crystal substrate using the wet-etching. Accordingly, the grooves 52 and 53 have a shape in which a crystal face of the quartz crystal is shown, as illustrated in FIG. 11. FIG. 11 illustrates across section corresponding to a cross section taken along line B-B in FIG. 1. Since an etching rate in the −X axial direction is lower than an etching rate in the +X axial direction, the side surface in the −X axial direction is comparatively gradually inclined, and the side surface in the +X axial direction is inclined close to verticality.

The size of the quartz crystal resonator blank 3 of the resonator element 2 used in this simulation has the length of 1160 μm, the width of 520 μm, and the thickness, that is, the thickness T of the vibrating arms 5 and 6, of 120 μm. It is confirmed by the inventors that the simulation result is rarely different from a simulation result obtained by performing the simulation which will be described below, which is obtained by changing the length, the width, and the thickness. In this simulation, the resonator element 2 is used in which the first and second driving electrodes 84 and 85 are not formed.

FIG. 19 is a graph illustrating a relationship of the $Q_{TED}a$ and the width W3 of the bank portions 511a, 511b, 512a, and 512b when η is respectively set to 0.40, 0.60, 0.70, 0.75, 0.80, 0.85, 0.90, 0.95, and 0.99. A lower limit $Q_{min}$ of $Q_{TED}a$ to be achieved in the resonator element 2 is set to 0.65, and indicated by a line L1. $Q_{TED}a$ is equal to or more than this value, and thus it is possible to show excellent vibrating characteristics.

From FIG. 19, when η is respectively set to 0.75, 0.80, 0.85, 0.90, 0.95, and 0.99, it is read that a region is present in which $Q_{TED}a$ is equal to or more than 0.65. From this, necessity for satisfaction of a relationship of "$0.75 \leq \eta < 1.00$" is read in that $Q_{TED}a \geq 0.65$, as described above.

FIG. 20 is a graph obtained by plotting each point where the respective graphs are crossed when $Q_{TED}a = 0.65$ in FIG. 19, and a graph illustrating a relationship of η and W3 when $Q_{TED}a = 0.65$ (Qmin).

In this case, the graph indicating a lower limit value of W3 is illustrated with the following expression (G).

$$W3 \,[\mu m] = 4.236 \times 10 \times \eta^2 - 8.473 \times 10 \times \eta + 4.414 \times 10 \,[\mu m] \quad (G)$$

The graph indicating an upper limit value of W3 is illustrated with the following expression (H).

$$W3\ [\mu m] = -3.367 \times 10 \times \eta^2 + 7.112 \times 10 \times \eta - 2.352 \times 10\ [\mu m] \quad (H)$$

Accordingly, it is read from FIG. 20 that the relationship illustrated with the expression (A) is satisfied, and thus the resonator element 2 is obtained which has $Q_{TED}a$ of 0.65 or more. In the above description, it is verified that the expression (A) is satisfied, high $Q_{TED}a$ of 0.65 or more is obtained, and thus the resonator element 2 has excellent vibrating characteristics.

Similarly, when η is respectively set to 0.80, 0.85, 0.90, 0.95, and 0.99, it is read from FIG. 19 that a region is present in which $Q_{TED}a$ is equal to or more than 0.70. From this, necessity for satisfaction of a relationship of "0.80≤η<1.00" is read in that $Q_{TED}a≥0.70$, as described above.

Figure 21:
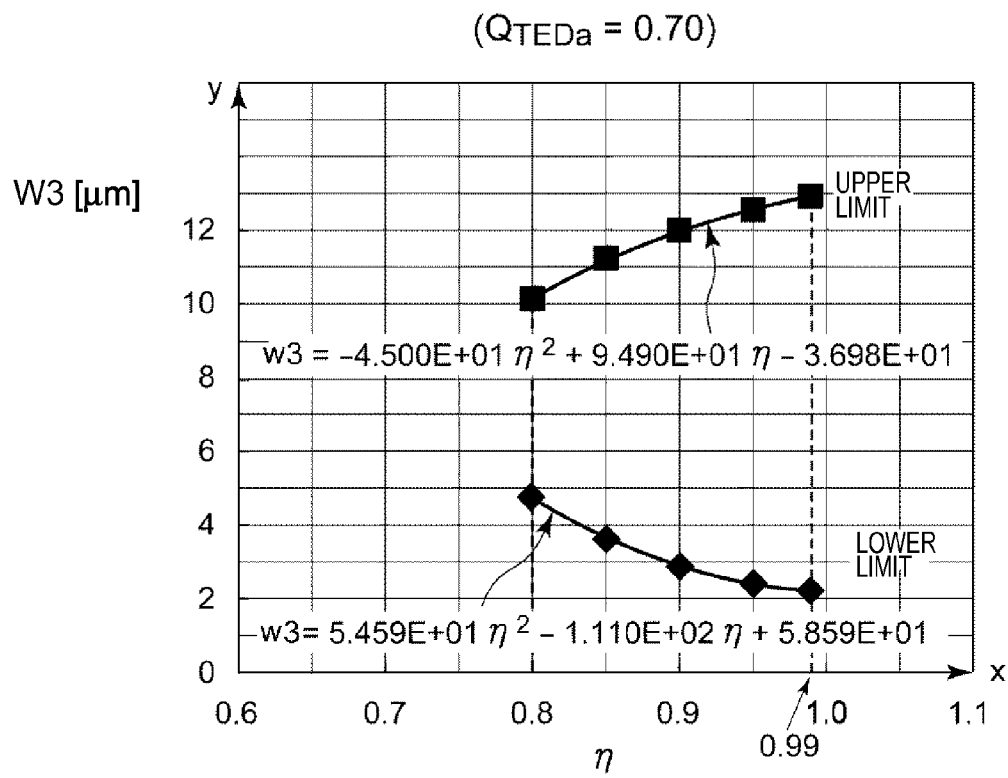
FIG. 21 is a graph illustrating a relationship of η and W3.

FIG. 21 is a graph obtained by plotting each point where the respective graphs is crossed when $Q_{TED}a=0.70$ in FIG. 19, and a graph illustrating a relationship of η and W3 when $Q_{TED}a=0.70$ ($Q_{min}$).

In this case, the graph indicating a lower limit value of W3 is illustrated with the following expression (J).

$$W3\ [\mu m] = 5.459 \times 10 \times \eta^2 - 1.110 \times 10^2 \times \eta + 5\ 859 \times 10\ [\mu m] \quad (J)$$

The graph indicating an upper limit value of W3 is illustrated with the following expression (K).

$$W3\ [\mu m] = -4.500 \times 10 \times \eta^2 + 9.490 \times 10 \times \eta - 3.698 \times 10\ [\mu m] \quad (K)$$

Accordingly, it is read from FIG. 21 that the relationship illustrated with the expression (B) is satisfied, and thus the resonator element 2 is obtained which has $Q_{TED}a$ of 0.70 or more. In the above description, it is verified that the expression (B) is satisfied, high $Q_{TED}a$ of 0.70 or more is obtained, and thus the resonator element 2 has excellent vibrating characteristics.

Similarly, when η is respectively set to 0.85, 0.90, 0.95, and 0.99, it is read from FIG. 19 that a region is present in which $Q_{TED}a$ is equal to or more than 0.75. From this, necessity for satisfaction of a relationship of "0.85≤η<1.00" is read in that $Q_{TED}a≥0.75$, as described above.

Figure 22:
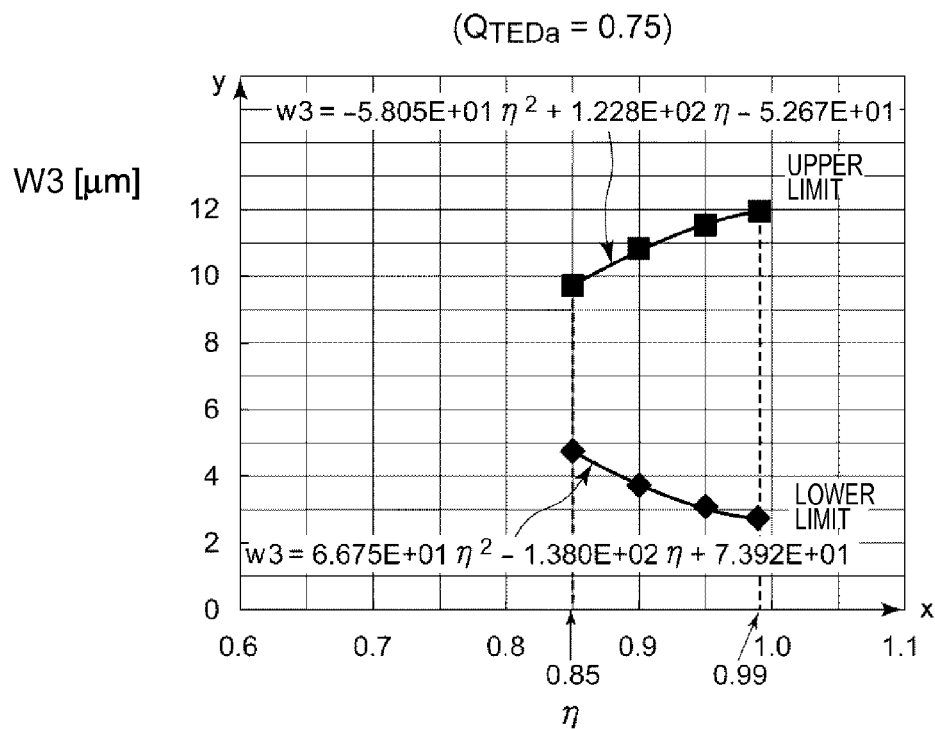
FIG. 22 is a graph illustrating a relationship of η and W3.

FIG. 22 is a graph obtained by plotting each point where the respective graphs is crossed when $Q_{TED}a=0.75$ in FIG. 19, and a graph illustrating a relationship of η and W3 when $Q_{TED}a=0.75$ ($Q_{min}$).

In this case, the graph indicating a lower limit value of W3 is illustrated with the following expression (L).

$$W3\ [\mu m] = 6.675 \times 10 \times \eta^2 - 1.380 \times 10^2 \times \eta 7.392 \times 10\ [\mu m] \quad (L)$$

The graph indicating an upper limit value of W3 is illustrated with the following expression (M).

$$W3\ [\mu m] = -5.805 \times 10 \times \eta^2 + 1.228 \times 10^2 \times \eta - 5.267 \times 10\ [\mu m] \quad (M)$$

Accordingly, it is read from FIG. 22 that the relationship illustrated with the expression (C) is satisfied, and thus the resonator element 2 is obtained which has $Q_{TED}a$ of 0.75 or more. In the above description, it is verified that the expression (C) is satisfied, high $Q_{TED}a$ of 0.75 or more is obtained, and thus the resonator element 2 has excellent vibrating characteristics.

Similarly, when η is respectively set to 0.90, 0.95, and 0.99, it is read from FIG. 19 that a region is present in which $Q_{TED}a$ is equal to or more than 0.80. From this, necessity for satisfaction of a relationship of "0.90≤η<1.00" is read in that $Q_{TED}a≥0.80$, as described above.

Figure 23:
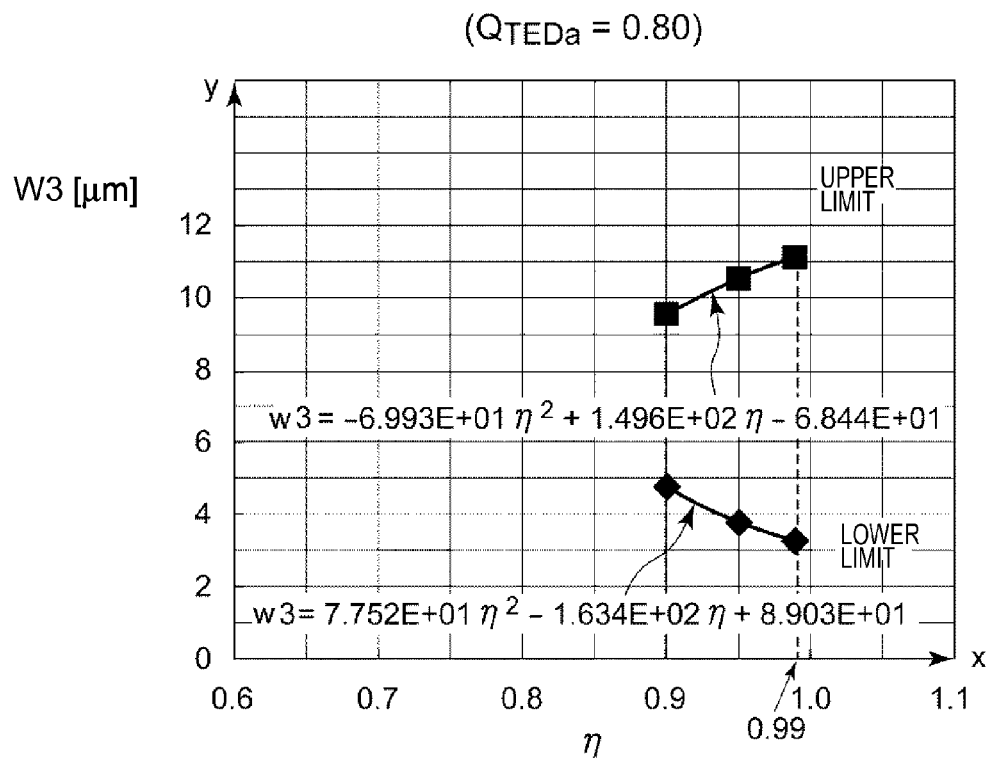
FIG. 23 is a graph illustrating a relationship of η and W3.

FIG. 23 is a graph obtained by plotting each point where the respective graphs is crossed when $Q_{TED}a=0.80$ in FIG. 19, and a graph illustrating a relationship of η and W3 when $Q_{TED}a=0.80$ ($Q_{min}$).

In this case, the graph indicating a lower limit value of W3 is illustrated with the following expression (N).

$$W3\ [\mu m] = 7.752 \times 10 \times \eta^2 - 1.634 \times 10^2 \times \eta + 8.903 \times 10\ [\mu m] \quad (N)$$

The graph indicating an upper limit value of W3 is illustrated with the following expression (P).

$$W3\ [\mu m] = -6.993 \times 10 \times \eta^2 + 1.496 \times 10^2 \times \eta - 6.844 \times 10\ [\mu m] \quad (P)$$

Accordingly, it is read from FIG. 23 that the relationship illustrated with the expression (D) is satisfied, and thus the resonator element 2 is obtained which has $Q_{TED}a$ of 0.80 or more. In the above description, it is verified that the expression (D) is satisfied, high $Q_{TED}a$ of 0.80 or more is obtained, and thus the resonator element 2 has excellent vibrating characteristics.

Similarly, when η is respectively set to 0.95, and 0.99, it is read from FIG. 19 that a region is present in which $Q_{TED}a$ is equal to or more than 0.85. From this, necessity for satisfaction of a relationship of "0.95≤η<1.00" is read in that $Q_{TED}a≥0.85$, as described above.

Figure 24:
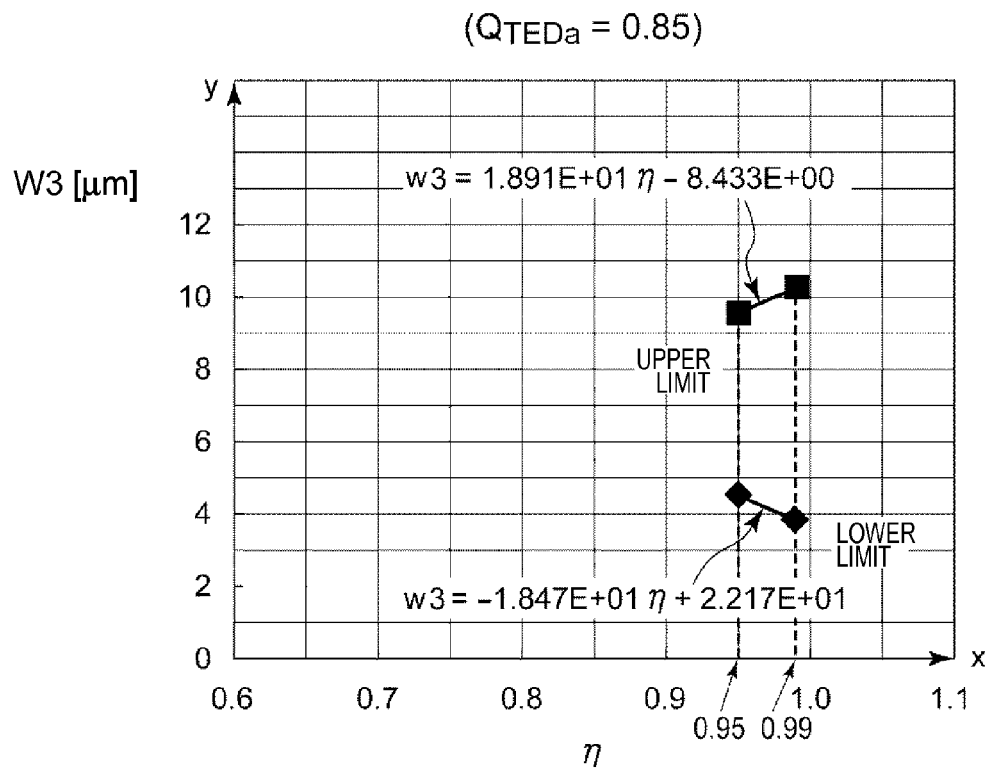
FIG. 24 is a graph illustrating a relationship of η and W3.

FIG. 24 is a graph obtained by plotting each point where the respective graphs is crossed when $Q_{TED}a=0.85$ in FIG. 19, and a graph illustrating a relationship of η and W3 when $Q_{TED}a=0.85$ ($Q_{min}$).

In this case, the graph indicating a lower limit value of W3 is illustrated with the following expression (Q).

$$W3\ [\mu m] = -1.847 \times 10 \times \eta + 2.217 \times 10\ [\mu m] \quad (Q)$$

The graph indicating an upper limit value of W3 is illustrated with the following expression (R).

$$W3\ [\mu m] = 1.189 \times 10 \times \eta - 8.433\ [\mu m] \quad (R)$$

Accordingly, it is read from FIG. 24 that the relationship illustrated with the expression (E) is satisfied, and thus the resonator element 2 is obtained which has $Q_{TED}a$ of 0.85 or more. In the above description, it is verified that the expression (E) is satisfied, high $Q_{TED}a$ of 0.85 or more is obtained, and thus the resonator element 2 has excellent vibrating characteristics.

Figure 25:
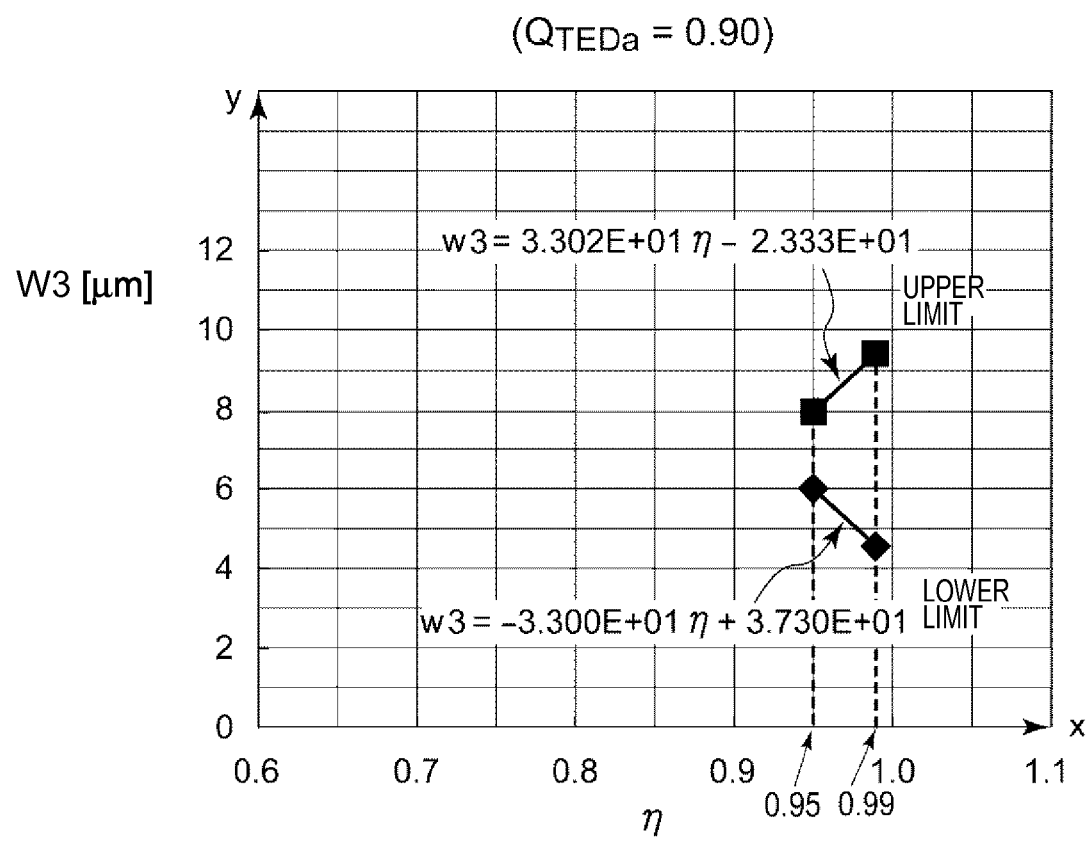
FIG. 25 is a graph illustrating a relationship of η and W3.

FIG. 25 is a graph obtained by plotting each point where the respective graphs is crossed when $Q_{TED}a=0.90$ in FIG. 19, and a graph illustrating a relationship of η and W3 when $Q_{TED}a=0.90$ ($Q_{min}$).

In this case, the graph indicating a lower limit value of W3 is illustrated with the following expression (S).

$$W3\ [\mu m] = -3.300 \times 10 \times \eta + 3.730 \times 10\ [\mu m] \quad (S)$$

The graph indicating an upper limit value of W3 is illustrated with the following expression (T).

$$W3\ [\mu m] = 3.302 \times 10 \times \eta - 2.333 \times 10\ [\mu m] \quad (T)$$

Accordingly, it is read from FIG. 25 that the relationship illustrated with the expression (F) is satisfied, and thus the resonator element 2 is obtained which has $Q_{TED}a$ of 0.90 or more. In the above description, it is verified that the expression (F) is satisfied, high $Q_{TED}a$ of 0.90 or more is obtained, and thus the resonator element 2 has excellent vibrating characteristics.

The relationship of a depth rate η (=2×t/T) of the grooves 52, 53, 62, and 63, and the width W3 of the bank portions 511a, 511b, 512a, and 512b is described above.

When the resonance frequency in the fundamental vibration mode (X reverse phase mode) is set to f0, and the resonance frequency in a vibration mode (spurious vibration mode) different from the fundamental vibration mode (X reverse phase mode) is set to f1 in the resonator element 2, a relationship of the following expression (19) is satisfied. Thus, combination of the fundamental vibration mode and the spurious vibration mode is reduced, and the resonator element 2 is obtained which has excellent vibrating characteristics (characteristics of excellent vibration balance and small vibration leakage).

$$|f0-f1|/f0 \geq 0.124 \quad (19)$$

This will be verified below based on an experimental result performed by the inventors. This experiment is performed in such a manner that the Z cut quartz crystal plate is patterned, and the resonator element having the size illustrated in FIG. 17 is used. In this experiment, as the spurious vibration mode, "X common mode" rises in which the vibrating arms 5 and 6 perform the flexural vibration on the same side as in the X axial direction, but "Z common mode" in which the vibrating arms 5 and 6 perform the flexural vibration on the same side as in the Z' axis, "Z reverse phase mode" in which the vibrating arms 5 and 6 perform the flexural vibration on a side opposite to the Z' axis, "torsional common mode" in which the vibrating arms 5 and 6 perform the torsion in the same direction around the Y' axis, and "torsional reverse phase mode" in which the vibrating arms 5 and 6 perform the torsion in a direction to each other around the Y' axis are included in addition to X common mode in the spurious vibration mode. It is considered that the resonance frequency in other spurious vibration modes except for the X common mode is equivalent to the resonance frequency in the X common mode in this experiment, and the combination of the fundamental vibration mode and the spurious vibration mode becomes weak, and thus it is possible to suppress an increase of the vibration leakage.

In following Table 2, the resonance frequency ω0 of four samples SAM1 to SAM4 in the fundamental vibration mode (X reverse phase mode), the resonance frequency ω1 of four samples SAM1 to SAM4 in the X common mode, a frequency difference Δf, and High performance FIG. 3 are illustrated. Δf is represented by the following expression (20), and High performance FIG. 3 is figures when the largest Q value in all samples is set to 1. Accordingly, it is meant that the Q value increases as High performance FIG. 3 approaches 1. FIG. 18 illustrates a graph obtained by plotting High performance FIG. 3 in the respective samples SAM1 to SAM4.

$$\Delta f = \frac{|\omega 0 - \omega 1|}{\omega 0} \quad (20)$$

TABLE 2

|  | X common mode [kHz] | X reverse phase mode [kHz] | |Δf| | Q | High performance FIG. 3 |
|---|---|---|---|---|---|
| SAM1 | 29.797 | 32.720 | 8.9% | 7,309 | 0.54 |
| SAM2 | 29.498 | 32.724 | 9.9% | 8,709 | 0.65 |
| SAM3 | 28.444 | 32.713 | 13.0% | 11,183 | 0.83 |
| SAM4 | 26.419 | 32.979 | 19.9% | 13,500 | 1.00 |

Here, if High performance FIG. 3 is equal to or more than 0.8, the resonator element 2 is obtained which has a sufficiently high Q value (having excellent vibrating characteristics), if High performance FIG. 3 is equal to or more than 0.9, the resonator element 2 is obtained which has a higher Q value, and if High performance FIG. 3 is 1, the resonator element 2 is obtained which has a further high Q value. A quadratic equation (approximate expression) linking High performance FIG. 3 in the respective samples is illustrated with the following expression (21). Thus, it is understood from the expression (21) that when High performance FIG. 3 is 0.8, Δf=0.124, when High performance FIG. 3 is 0.9, Δf=0.15, and when High performance FIG. 3 is 1, Δf=0.2.

$$-4.016 \times 10^1 \times \Delta f^2 + 1.564 \times 10^1 \times \Delta f - 5.238 \times 10^{-1} \quad (21)$$

Accordingly, it is verified that the resonator element 2 is obtained which has excellent vibrating characteristics by satisfaction of the expression (19), the resonator element 2 is obtained which has more excellent vibrating characteristics by satisfaction of the expression (22), and the resonator element 2 is obtained which has further excellent vibrating characteristics by satisfaction of the expression (23).

$$|f0-f1|/f0 \geq 0.145 \quad (22)$$

$$|f0-f1|/f0 \geq 0.2 \quad (23)$$

The resonator element 2 as described above may be manufactured by using the photolithography technique and the wet-etching technique, for example, in the following manner.

First, the quartz crystal resonator blank 3 is prepared. The quartz crystal resonator blank 3 may be made by patterning by wet-etching the Z cut quartz crystal substrate.

For example, a metal film is formed on the entire surface of the quartz crystal resonator blank 3 by evaporation, sputtering, and the like, and then a photoresist film (positive photoresist film) is formed on the metal film. Patterning is performed by exposing and developing the photoresist film, and thus a resist pattern corresponding to shapes of the first and second driving electrodes 84 and 85 to be formed is formed.

Wet-etching is performed through the resist pattern formed in this manner. Thus, parts of the metal film are removed which are exposed by the resist pattern, and then the resist pattern is removed.

It is possible to obtain the resonator element 2 by performing the processes.

Second Embodiment

A second embodiment of a resonator will be described in the invention.

Figure 26:
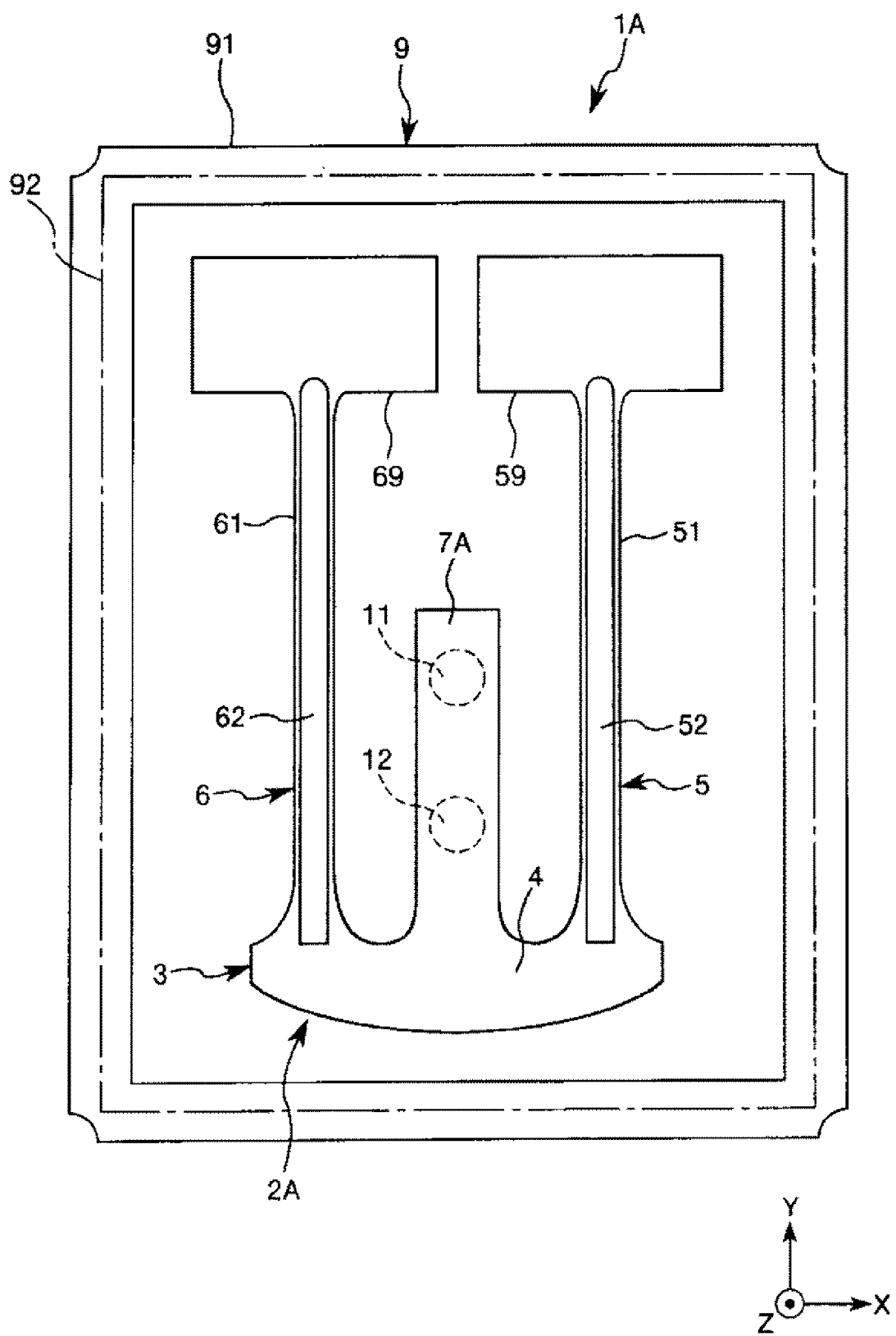
FIG. 26 is a top view of a resonator according to a second embodiment of the invention.

FIG. 26 is a top view of a resonator according to a second embodiment of the invention.

The resonator of the second embodiment will be described focusing on a difference from the above described first embodiment, and description of the same items will be omitted.

The resonator according to the second embodiment in the invention is similar to the first embodiment except for a different configuration of the resonator element. The same components as those of the described first embodiment are denoted by the same reference numerals.

As illustrated in FIG. 26, a supporting portion 7A of a resonator element 2A extends from the tip end of the base 4 in the +Y' axial direction, and is positioned between the vibrating arms 5 and 6 in the resonator 1A. The resonator element 2A is fixed to a base 91 through the conductive adhesives 11 and 12 in the supporting portion 7A. With such a configuration, it is possible to minimize the resonator element 2A compared to the described resonator element 2 according to the first embodiment.

It is possible to also show a similar effect to that of the described first embodiment in the second embodiment.

Third Embodiment

A third embodiment of a resonator will be described in the invention.

Figure 27:
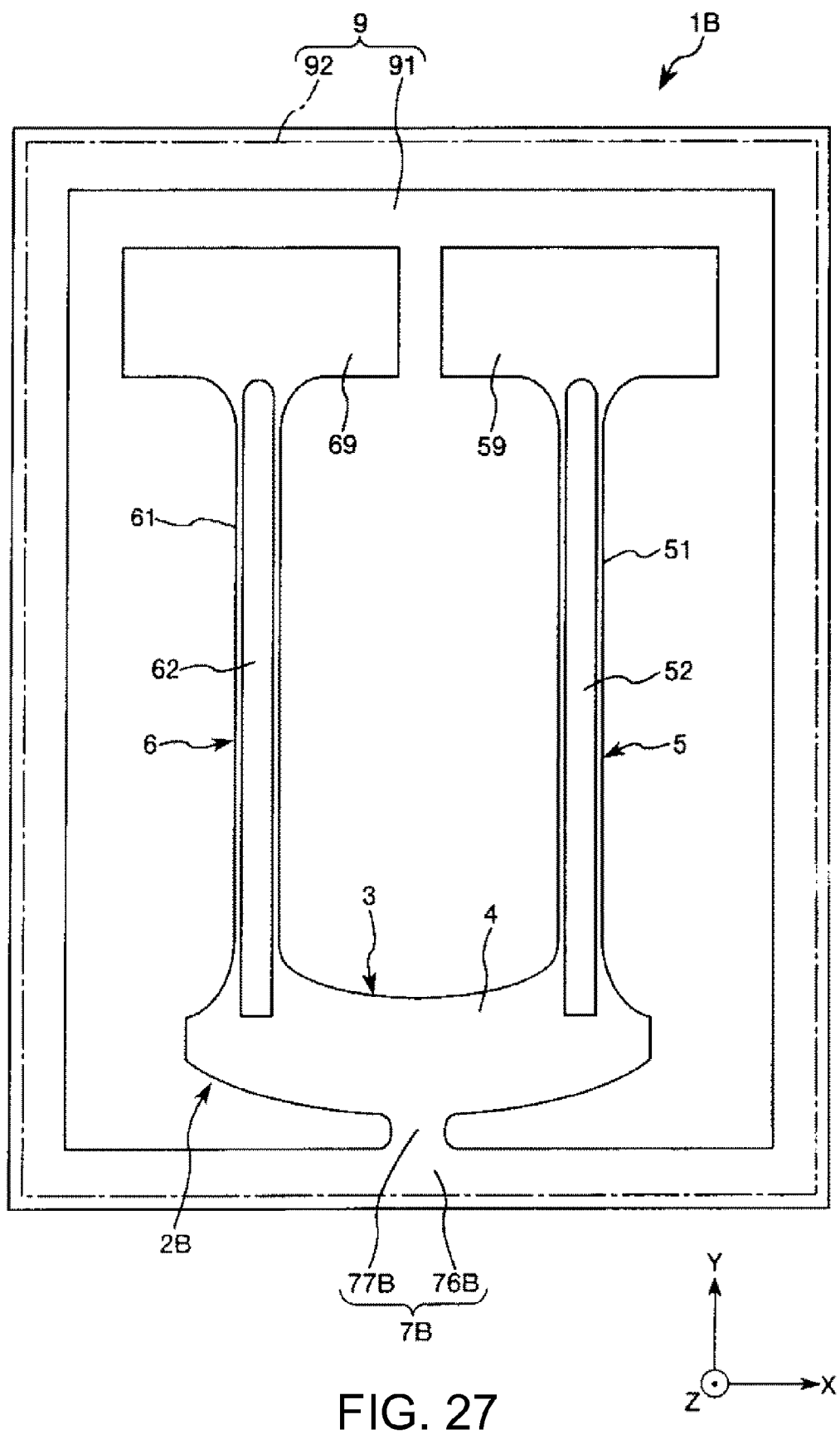
FIG. 27 is a top view of a resonator according to a third embodiment of the invention.

FIG. 27 is a top view of a resonator according to a third embodiment of the invention.

The resonator of the third embodiment will be described focusing on a difference from the above described first embodiment, and description of the same items will be omitted.

The resonator according to the third embodiment in the invention is similar to the first embodiment except for a different configuration of the resonator element. The same components as the described in the first embodiment are denoted by the same reference numerals.

As illustrated in FIG. 27, a supporting portion 7B of a resonator element 2B includes a frame-shaped frame portion 76B and a joining portion 77B, the frame-shaped frame portion 76B surrounds the base 4 and the vibrating arms 5 and 6, and the joining portion 77B joins the frame portion 76B and the base portion of the base 4. This resonator element 2B is fixed to the package 9 by interposition of the frame portion 76B between the base 91 having a common cavity-shaped and a lid 92. Since fixation is not required by the conductive adhesives 11 and 12 in such a configuration, for example, it is possible to reduce occurrence of outgas, and the like. The first and second driving electrodes 84 and 85 and the external terminals 953 and 963 may be connected through the frame portion 76B. Since the frame portion 76B and the vibrating arms 5 and 6 are integrally formed, and it is possible to accurately form a distance between the frame portion 76B and the vibrating arms 5 and 6, it is possible to obtain the large vibrating arms 5 and 6 compared to when being fixed to the package 9 by the conductive adhesives 11 and 12. It is possible to lengthen a path through which heat generated during the flexural vibration flows by making the arms 51 and 61 thick such that a lowered vibration frequency due to the vibrating arms 5 and 6 becoming long matches the original vibration frequency. As a result, it is possible to reduce the thermoelastic loss in the adiabatic-like region and to reduce the CI value.

It is possible to also show a similar effect to the described first embodiment in the third embodiment.

2. Oscillator

An oscillator (oscillator according to the invention) will be described below in which the resonator element according to the invention is applied.

Figure 28:
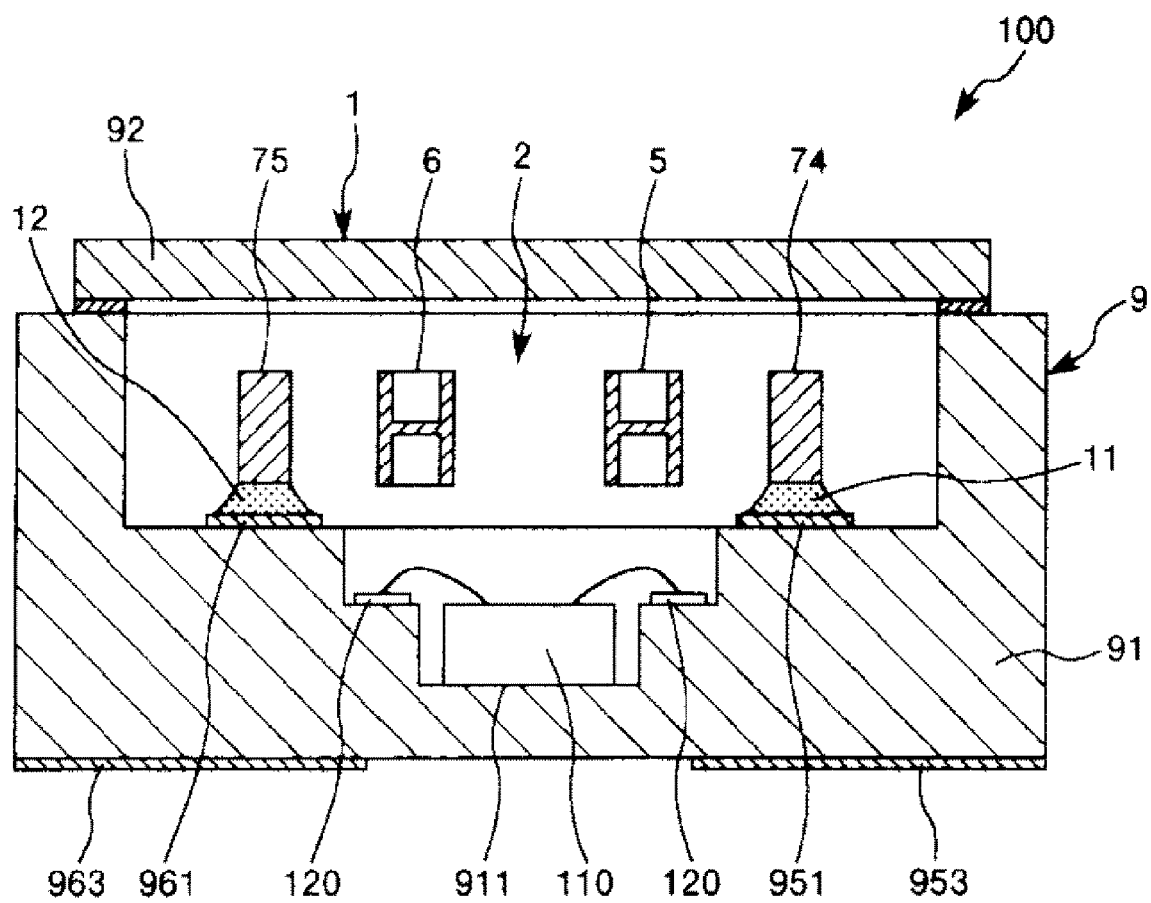
FIG. 28 is a cross-sectional view illustrating an embodiment suitable for an oscillator according to the invention.

FIG. 28 is a cross-sectional view illustrating an embodiment suitable for the oscillator according to the invention.

The oscillator 100 illustrated in FIG. 28 includes the resonator 1 and an IC chip 110 for driving the resonator element 2. The oscillator 100 will be described focusing on a difference from the described resonator, and description of the same items will be omitted.

As illustrated in FIG. 28, in the oscillator 100, the IC chip 110 is fixed to the concave portion 911 of the base 91. The IC chip 110 is electrically connected to a plurality of internal terminals 120 formed on the bottom surface of the concave portion 911. When the connection terminals 951 and 961 are connected to the plurality of internal terminals 120, the external terminals 953 and 963 are connected to the plurality of internal terminals 120. The IC chip 110 has an oscillation circuit for controlling driving of the resonator element 2. When the resonator element 2 is driven by the IC chip 110, a signal at a predetermined frequency may be pulled out.

3. Electronic Device

An electronic device (electronic device according to the invention) will be described below in which the resonator element according to the invention is applied.

Figure 29:
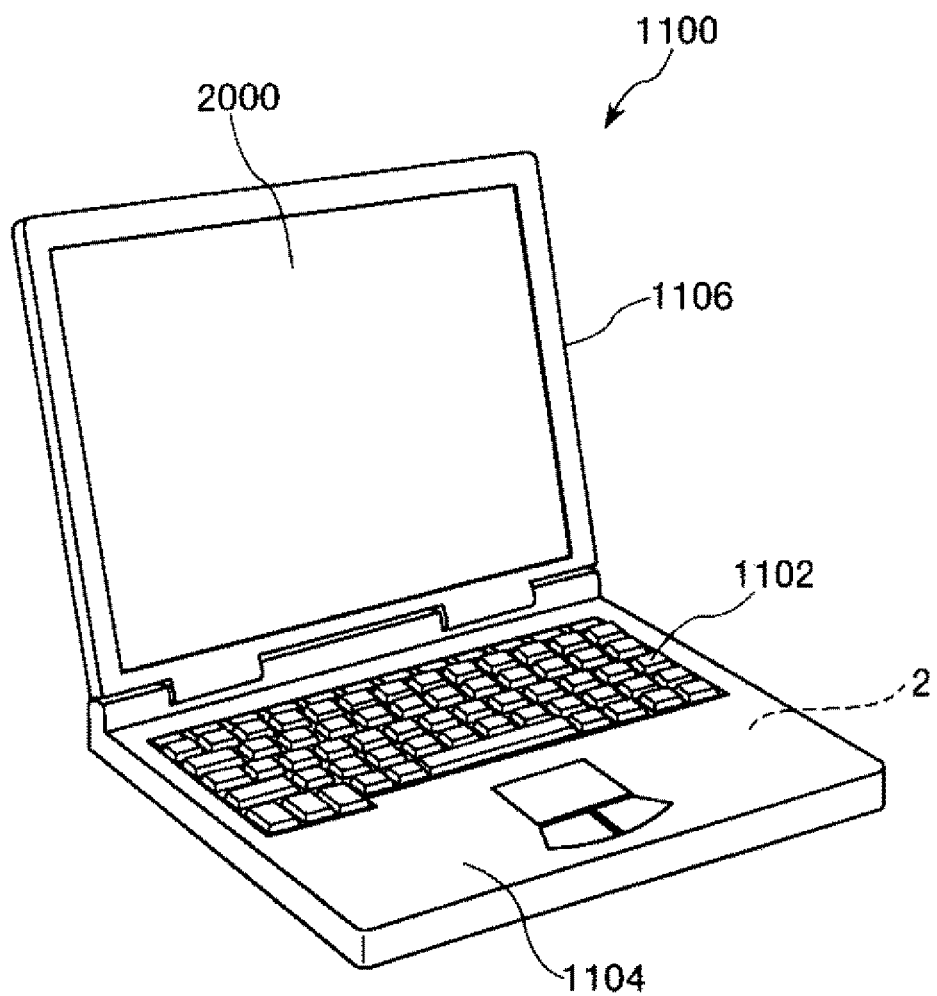
FIG. 29 is a perspective view illustrating a configuration of a mobile type (or note type) personal computer in which an electronic device according to the invention is applied.

FIG. 29 is a perspective view illustrating a configuration in which a mobile type (or note type) personal computer applied as an electronic device according to the invention is applied. In FIG. 29, the personal computer 1100 is configured with a main body 1104 including a keyboard 1102 and a display unit 1106 including a display 2000. The display unit 1106 is rotatably supported through a hinge structure with respect to the main body 1104. A filter and the resonator element 2 serving as a resonator, a reference clock, and the like are embedded in the personal computer 1100.

Figure 30:
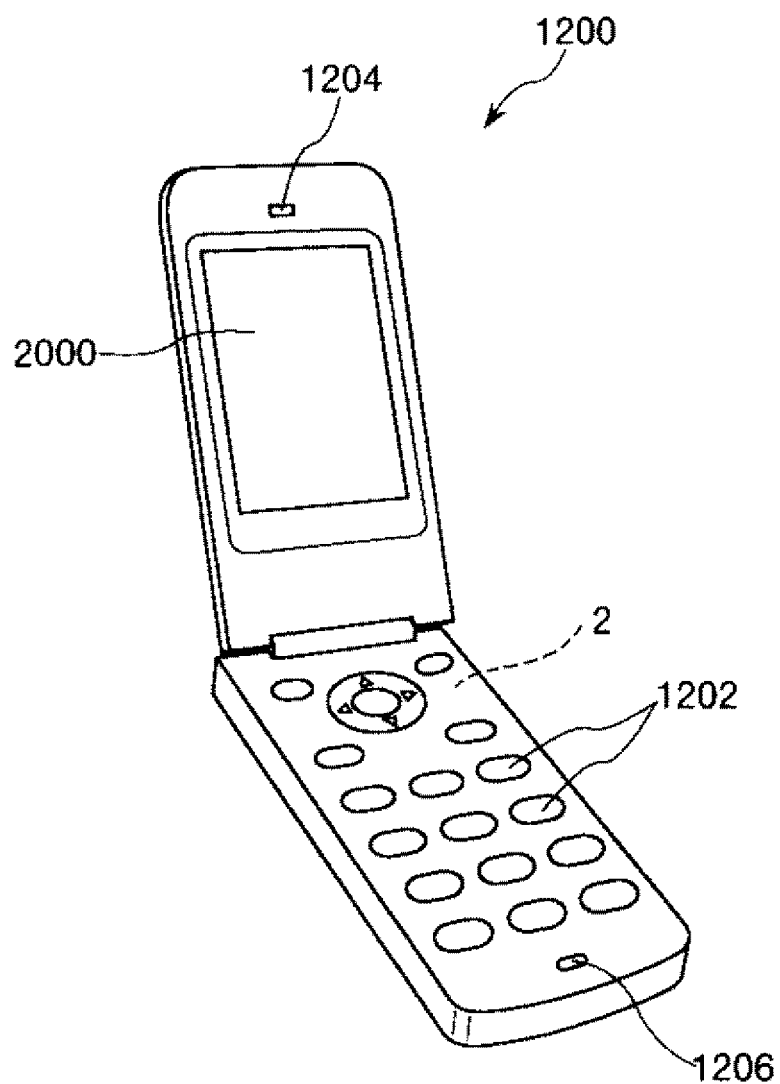
FIG. 30 is a perspective view illustrating a configuration of a mobile phone in which the electronic device according to the invention is applied (also including PHS).

FIG. 30 is a perspective view illustrating a configuration of a mobile phone in which the electronic device according to the invention is applied (also including PHS). In FIG. 30, the mobile phone 1200 includes a plurality of operation buttons 1202, a receiver 1204, and a transmitter port 1206, and a display 2000 is disposed between the operation buttons 1202 and the receiver 1204. In this mobile phone 1200, the resonator element 2 serving as a filter and a resonator and the like is embedded.

Figure 31:
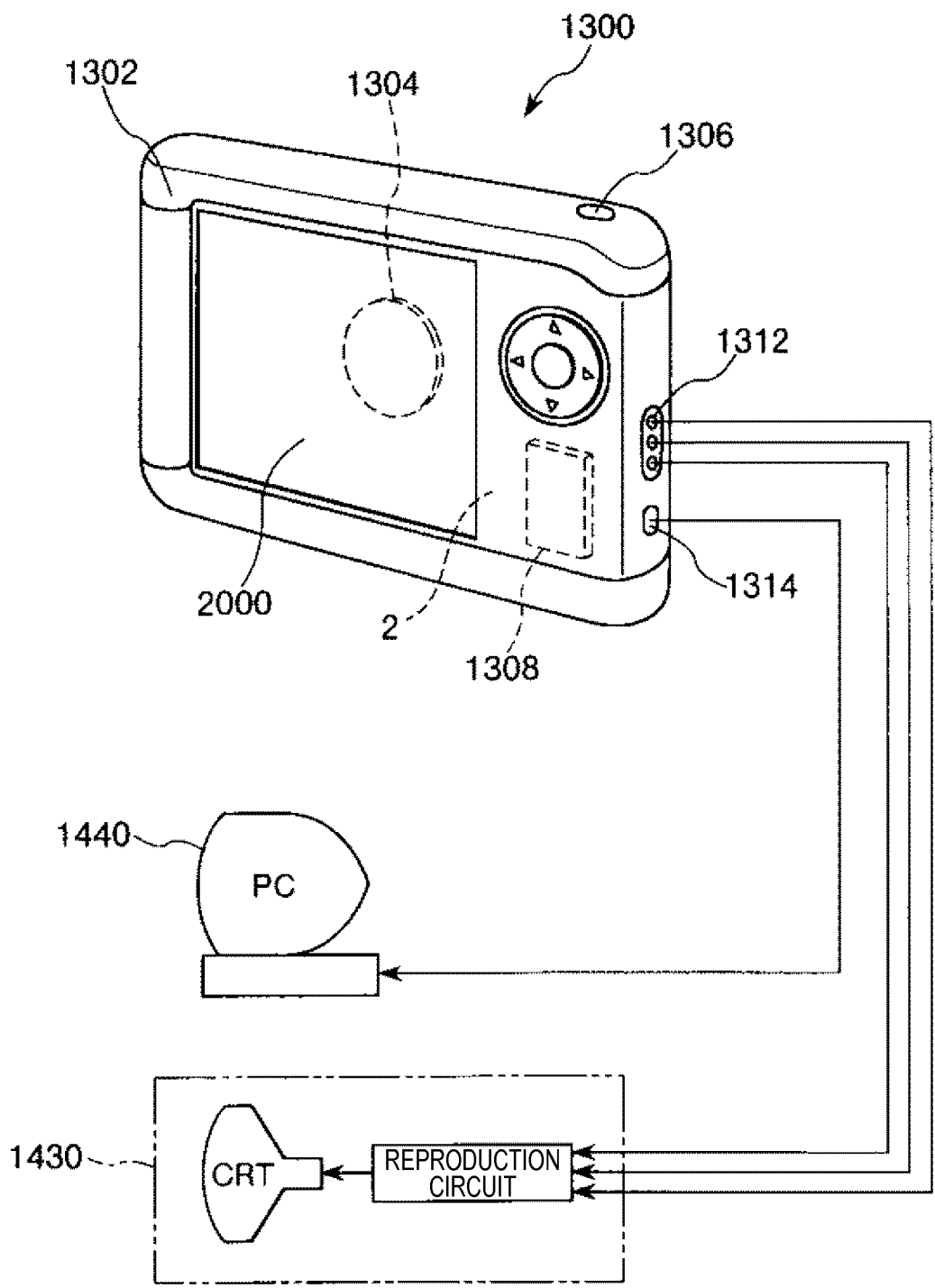
FIG. 31 is a perspective view illustrating a configuration of a digital still camera in which the electronic device according to the invention is applied.

FIG. 31 is a perspective view illustrating a configuration of a digital still camera in which the electronic device according to the invention is applied. In FIG. 31, a connection to an external device is simply illustrated. Here, a general camera exposes a silver salt photo film with a light image of a subject, but the digital still camera 1300 performs photoelectric-converting of the light image of the subject by an imaging element such as a charge coupled device (CCD) and generates an imaged signal.

The display is provided on a back surface of a case (body) 1302 in the digital still camera 1300, and the display functions as a finder which displays the subject as an electronic image in the configuration in which display is performed based on the imaging signal from the CCD. A light receiving unit 1304 including an optical lens (imaging optical system), the CCD, or the like is provided on the front surface side (rear surface side in Figure) of the case 1302.

When a photographer confirms a subject image displayed on the display and presses a shutter button 1306, an imaging signal of the CCD at that time is transmitted to and stored in a memory 1308. In this digital still camera 1300, a video output terminal 1312, and an input and output terminal 1314 for data communication are provided on a side surface of the case 1302. As illustrated in FIG. 31, a television monitor 1430 is connected to the video output terminal 1312, and the personal computer 1440 is connected to the input and output terminal 1314 for data communication, as necessary. The configuration is made in which the imaging signal stored in the memory 1308 is output to the television monitor 1430 or the personal computer 1440 by a predetermined operation. In this digital still camera 1300, the resonator element 2 serving as a filter and a resonator and the like is embedded.

The electronic device including the resonator element according to the invention can be applied to an ink jet type discharge device (for example, an ink jet printer), a laptop type personal computer, a television, a video camera, a video tape recorder, a car navigation device, a pager, an electronic note (including a member having a communication function), an electronic dictionary, an electronic calculator, an electronic game device, a word processor, a work station, a picture phone, a television monitor for crime prevention, electronic binoculars, a POS terminal, medical equipment (for example, an electronic thermometer, a sphygmomanometer, a blood sugar meter, an electrocardiogram measurement device, an ultrasonograph, or an electronic endoscope), a fish finder, various measuring equipment, instruments (for example, a vehicle, a plane, or the instruments of the ship), and a flight simulator in addition to the personal computer in FIG. 29 (mobile type personal computer), the mobile phone in FIG. 30, and the digital still camera in FIG. 31.

4. Mobile Object

The mobile object (the mobile object according to the invention) will be described in which the resonator element according to the invention is applied.

Figure 32:
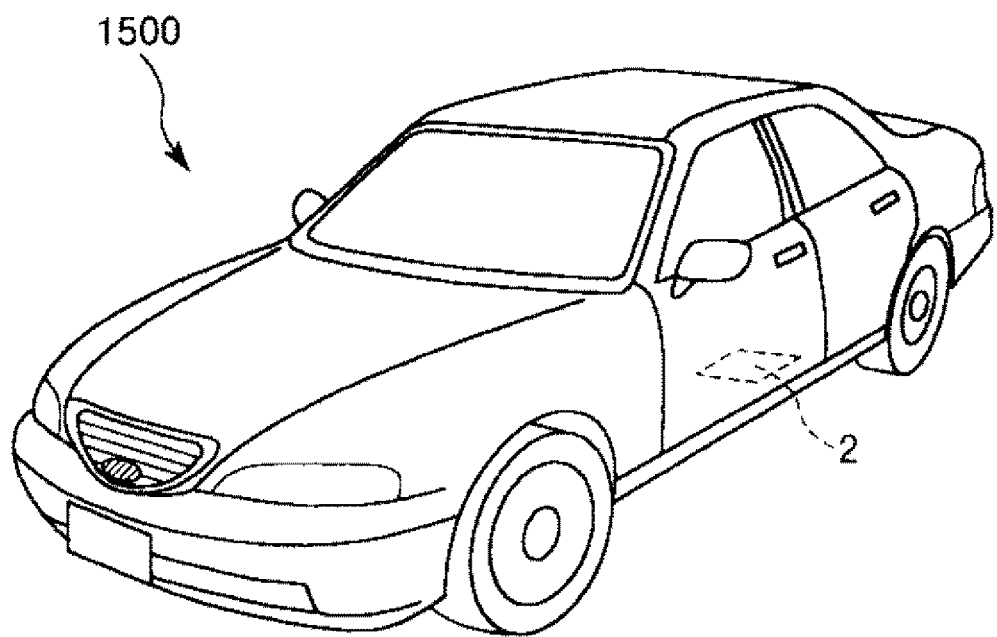
FIG. 32 is a perspective view illustrating an automobile in which a mobile object according to the invention is applied.

FIG. 32 is a perspective view illustrating an automobile applied as a mobile object according to the invention. In an automobile 1500, the resonator element 2 is mounted. The resonator element 2 can be widely applied to a keyless entry, an immobilizer, a car navigation system, a car air-conditioner, an antilock brake system (ABS), an airbag, a tire pressure monitoring system (TPMS), an electronic control unit (ECU) such as an engine control, a battery monitoring of a hybrid car and an electric car, and a car body posture control system.

The resonator element, the resonator, the oscillator, the electronic device, and the mobile object are described based on the illustrated embodiments, but the invention is not limited thereto, and the configurations of the respective sections may be substituted with any configuration having the same function. In the invention, other arbitrary components may be added. In addition, the respective embodiments may be appropriately combined.

In the described embodiment, the quartz crystal substrate is used as a piezoelectric substrate, but instead of this, various piezoelectric substrates can be used such as lithium niobate ($LiNbO_3$), lithium ($LiTaO_3$) tantalate, lithium tetraborate ($Li_2B_4O_7$), potassium niobate ($KNbO_3$), gallium phosphate ($GaPO_4$), langasite ($La_3Ga_5SiO_{14}$), gallium arsenide (GaAs), aluminum nitride (AlN), zinc oxide (ZnO, $Zn_2O_3$), barium titanate ($BaTiO_3$), lead titanate ($PbPO_3$), zirconic acid lead titanate (PZT), sodium potassium niobate ((K,Na) $NbO_3$), bismuth ferrite ($BiFeO_3$), sodium niobate ($NaNbO_3$), bismuth titanate ($Bi_4Ti_3O_{12}$), and bismuth sodium titanate ($Na_{0.5}Bi_{0.5}TiO_3$).

What is claimed is:

1. A resonator element comprising:
   a base; and
   a pair of vibrating arms that extend from the base in a first direction in a plan view and that are disposed in parallel in a second direction orthogonal to the first direction, each of the vibrating arms including (i) a weight portion at a terminal end of the vibrating arm, (ii) an arm section extending from the base to the weight portion, and (iii) a main surface facing a third direction orthogonal to the first and second directions and that is flat throughout the arm section and the weight portion, wherein:
   when a thickness of each of the vibrating arms is set to T, and a distance between the weight portions in the second direction is set to W4, the following relationship is satisfied:

$0.033 \times T < W4 < 0.330 \times T$ [μm], and when a width of each of the arm sections in the second direction is set to W1, and a width of each of the weight portions in the second direction is set to W2, the following relationship is satisfied:

$1.6 \leq W2/W1 \leq 7.0$.

2. The resonator element according to claim 1, wherein the T is in a range of 50 μm≤T≤140 μm.

3. The resonator element according to claim 1, wherein the T is in a range of 110 μm≤T≤140 μm.

4. The resonator element according to claim 1, wherein when a length of each of the vibrating arms in the first direction is set to L, and a length of the weight portion of each of the vibrating arms in the first direction is set to H, the following relationship is satisfied:

$0.183 < H/L < 0.597$.

5. The resonator element according to claim 1, wherein when a length of each of the vibrating arms in the first direction is set to L, and a length of the weight portion of each of the vibrating arms in the first direction is set to H, the following relationship is satisfied:

$0.012 < H/L < 0.30$.

6. The resonator element according to claim 1, wherein:
   grooves are provided on a first main surface and a second main surface that are respectively on a front and a back of each of the vibrating arms, and
   when (i) summation of a depth of the groove on the first main surface and a depth of the groove on the second main surface is set to ta, (ii) a relationship of ta/T is set to η, and (iii) a width of a said main surface in the second direction between an outer circumference of the each vibrating arm and a said groove is set to W3 in the plan view, the following relationship is satisfied:

$4.236 \times 10 \times \eta^2 - 8.473 \times 10 \times \eta + 4.414 \times 10$ [μm] $\leq W3 \leq -3.367 \times 10 \times \eta^2 + 7.112 \times 10 \times \eta - 2.352 \times 10$ [μm].

7. A resonator comprising:
   the resonator element according to claim 1; and
   a package storing the resonator element.

8. A resonator comprising:
   the resonator element according to claim 2; and
   a package storing the resonator element.

9. A resonator comprising:
   the resonator element according to claim 3; and
   a package storing the resonator element.

10. An oscillator comprising:
    the resonator element according to claim 1; and
    an oscillation circuit electrically connected to the resonator element.

11. An oscillator comprising:
    the resonator element according to claim 2; and
    an oscillation circuit electrically connected to the resonator element.

12. An oscillator comprising:
    the resonator element according to claim 3; and
    an oscillation circuit electrically connected to the resonator element.

13. An electronic device comprising:
    the resonator element according to claim 1.

14. An electronic device comprising:
    the resonator element according to claim 2.

15. An electronic device comprising:
    the resonator element according to claim 3.

16. A mobile object comprising:
    the resonator element according to claim 1.

17. A mobile object comprising:
    the resonator element according to claim 2.

18. A mobile object comprising:
    the resonator element according to claim 3.

19. The resonator element according to claim 1, wherein:
grooves are provided on a first main surface and a second main surface that are respectively on a front and a back of each of the vibrating arms, and
when a summation of a depth of the groove on the first main surface and a depth of the groove on the second main surface is set to ta, a relationship of ta/T is set to $0.292 \leq ta/T \leq 0.483$.

20. The resonator element according to claim 1,
grooves are provided on a first main surface and a second main surface that are respectively on a front and a back of each of the vibrating arms, and
when a summation of a depth of the groove on the first main surface and a depth of the groove on the second main surface is set to ta, a relationship of ta/T is set to $0.455 \leq ta/T \leq 0.483$.

21. The resonator element according to claim 1, wherein:
at least a main surface of each of the vibrating arms is provided with a groove, and
a width of the main surface in the second direction between an outer circumference of the each arm to an inner surface of the each arm is set to W1, such that W1 is in a range of 16 μm to 300 μm.

22. The resonator element according to claim 1, wherein:
at least a main surface of each of the vibrating arms is provided with a groove, and
when a depth of the groove on the main surface is set to t, a relationship of t/T is set to $0.375 \leq t/T \leq 0.483$.

23. The resonator element according to claim 22,
wherein when a width of the main surface in the second direction between an outer circumference of the each vibrating arm and the groove is set to W3 in the plan view, the following relationship is set:

$$-8.835 \times 10^1 \times \left(\frac{t}{T}\right)^2 + 8.737 \times 10^1 \times \left(\frac{t}{T}\right) - 1.872 \times 10^1 \leq$$
$$W3 \leq 1.136 \times 10^2 \times \left(\frac{t}{T}\right)^2 - 1.385 \times 10^2 \times \left(\frac{t}{T}\right) + 5.205 \times 10^1.$$

24. A resonator element comprising:
a base; and
a pair of vibrating arms that extend from the base in a first direction in a plan view and that are disposed in parallel in a second direction orthogonal to the first direction, each of the vibrating arms including (i) a weight portion at a terminal end of the vibrating arm, (ii) an arm section narrower in the second direction than the weight portion and extending from the weight portion to the base, and (iii) a main surface facing a third direction orthogonal to the first and second directions and that is flat throughout the arm section and the weight portion, wherein:
when a thickness of each of the vibrating arms in the third direction is set to T, and a distance between the weight portions in the second direction is set to W4, the following relationship is satisfied:
$0.033 \times T < W4 < 0.330 \times T$ [μm], and
when a width of each of the arm sections in the second direction is set to W1, and a width of each of the weight portions in the second direction is set to W2, the following relationship is satisfied:
$1.6 \leq W2/W1 \leq 7.0$.

25. The resonator element according to claim 24,
wherein when an entire length of each of the vibrating arms in the first direction is set to L, a length of the weight portion of each of the vibrating arms in the first direction is set to H, the following relationship is satisfied:
$0.046 \leq H/L \leq 0.223$.

* * * * *